(12) United States Patent
Zhi et al.

(10) Patent No.: US 10,868,267 B2
(45) Date of Patent: Dec. 15, 2020

(54) ELECTROLUMINESCENT DEVICE AND A LIGHT EMITTING SYSTEM

(71) Applicant: City University of Hong Kong, Kowloon (HK)

(72) Inventors: Chunyi Zhi, New Territories (HK); Guojin Liang, Kowloon Tong (HK)

(73) Assignee: City University of Hong Kong, Kowloon (HK)

(*) Notice: Subject to any disclaimer, the term of this patent is extended or adjusted under 35 U.S.C. 154(b) by 11 days.

(21) Appl. No.: 16/027,583

(22) Filed: Jul. 5, 2018

(65) Prior Publication Data
US 2020/0013980 A1 Jan. 9, 2020

(51) Int. Cl.
| | |
|---|---|
| H01L 51/50 | (2006.01) |
| H01L 51/52 | (2006.01) |
| H01L 51/56 | (2006.01) |
| H01L 51/00 | (2006.01) |
| H01G 11/32 | (2013.01) |
| H01G 11/56 | (2013.01) |
| H01G 11/86 | (2013.01) |

(Continued)

(52) U.S. Cl.
CPC ......... *H01L 51/5032* (2013.01); *H01G 11/10* (2013.01); *H01G 11/26* (2013.01); *H01G 11/32* (2013.01); *H01G 11/56* (2013.01); *H01G 11/86* (2013.01); *H01L 51/0003* (2013.01); *H01L 51/004* (2013.01); *H01L 51/0021* (2013.01); *H01L 51/0034* (2013.01); *H01L 51/502* (2013.01); *H01L 51/5215* (2013.01); *H01L 51/5234* (2013.01); *H01L 51/56* (2013.01); *H01L 2251/301* (2013.01); *H01L 2251/5338* (2013.01); *H01L 2251/556* (2013.01); *H01L 2251/568* (2013.01)

(58) Field of Classification Search
CPC . H01L 51/5032; H01L 51/5234; H01L 51/56; H01L 51/0021; H01L 51/0003; H01L 51/5215; H01G 11/32
See application file for complete search history.

(56) References Cited

U.S. PATENT DOCUMENTS

| | | |
|---|---|---|
| 5,103,269 A | 4/1992 | Tomomura et al. |
| 9,087,998 B2 | 7/2015 | Jang et al. |

(Continued)

OTHER PUBLICATIONS

Guojin Liang, Ming Yi, Haibo Hu, Ke Ding, Lei Wang, Haibo Zeng, Jiang Tang, Lei Liao, Cewen Nan, Yunbin He, and Changhui Ye; Coaxial-Structured Weavable and Wearable Electroluminescent Fibers. Advanced Electronic Materials, 3, 2017, 1700401.

Guojin Liang, Haibo Hu, Lei Liao, Yunbin He, and Changhui Ye; Highly Flexible and Bright Electroluminescent Devices Based on Ag Nanowire Electrodes and TopEmission Structure. Advanced Electronic Materials, 2017, 3, 1600535.

(Continued)

*Primary Examiner* — Dung A. Le
(74) *Attorney, Agent, or Firm* — Renner Kenner Greive Bobak Taylor & Weber

(57) ABSTRACT

An electroluminescent device including an electrode, the electrode being ionically conductive; an electroluminescence layer positioned adjacent or in contact with the electrode, the electroluminescence layer being electrically coupled to the electrode; the electroluminescence layer receiving electrical energy from the electrode and illuminating in response to received electrical energy, and wherein the electrode and the electroluminescence layer are repairable such that the function of the electrode and the electroluminescence layer is restored after a deformation.

21 Claims, 16 Drawing Sheets

(51) Int. Cl.
*H01G 11/26* (2013.01)
*H01G 11/10* (2013.01)

(56) References Cited

U.S. PATENT DOCUMENTS

| | | | |
|---|---|---|---|
| 9,574,134 B2 | 2/2017 | Wood et al. | |
| 2003/0080677 A1* | 5/2003 | Mikhael | C23C 14/12 313/504 |
| 2007/0281386 A1* | 12/2007 | Park | H01L 51/0002 438/99 |
| 2011/0227047 A1* | 9/2011 | Wen | B82Y 10/00 257/40 |
| 2016/0057835 A1 | 2/2016 | Wang et al. | |
| 2018/0323400 A1* | 11/2018 | Larson | H01L 51/5032 |
| 2019/0123282 A1* | 4/2019 | Bao | H01L 51/502 |
| 2019/0305258 A1* | 10/2019 | Lin | H01L 51/5209 |
| 2020/0002501 A1* | 1/2020 | Yun | C08K 3/041 |

OTHER PUBLICATIONS

Guojin Liang, Haibo Hu, Lei Liao, Yunbin He, and Changhui Ye; Highly Flexible and Bright Electroluminescent Devices Based on Ag Nanowire Electrodes and TopEmission Structure. Advanced Electronic Materials, Supporting Information for Adv. Electron. Mater., DOI: 10.1002/aelm.201600535.

C. Larson, B. Peele, S. Li, S. Robinson, M. Totaro, L. Beccai, B. Mazzolai, R. Shepherd; Highly stretchable electroluminescent skin for optical signaling and tactile sensing, Science, 351, 1071 (2016).

Jiangxin Wang, Chaoyi Yan, Guofa Cai, Mengqi Cui, Alice Lee-Sie Eh, and Pooi See Lee; Exremely Stretchable Electroluminescent Devices with Ionic Conductors, Advanced Materials 2016, 28, 4490.

Jiangxin Wang, Chaoyi Yan, Guofa Cai, Mengqi Cui, Alice Lee-Sie Eh, and Pooi See Lee; Extremely Stretchable Electroluminescent Devices with Ionic Conductors, Advanced Materials, Supporting Information for Adv. Mater., DOI: 10.1 002/adma.20 1504187.

* cited by examiner

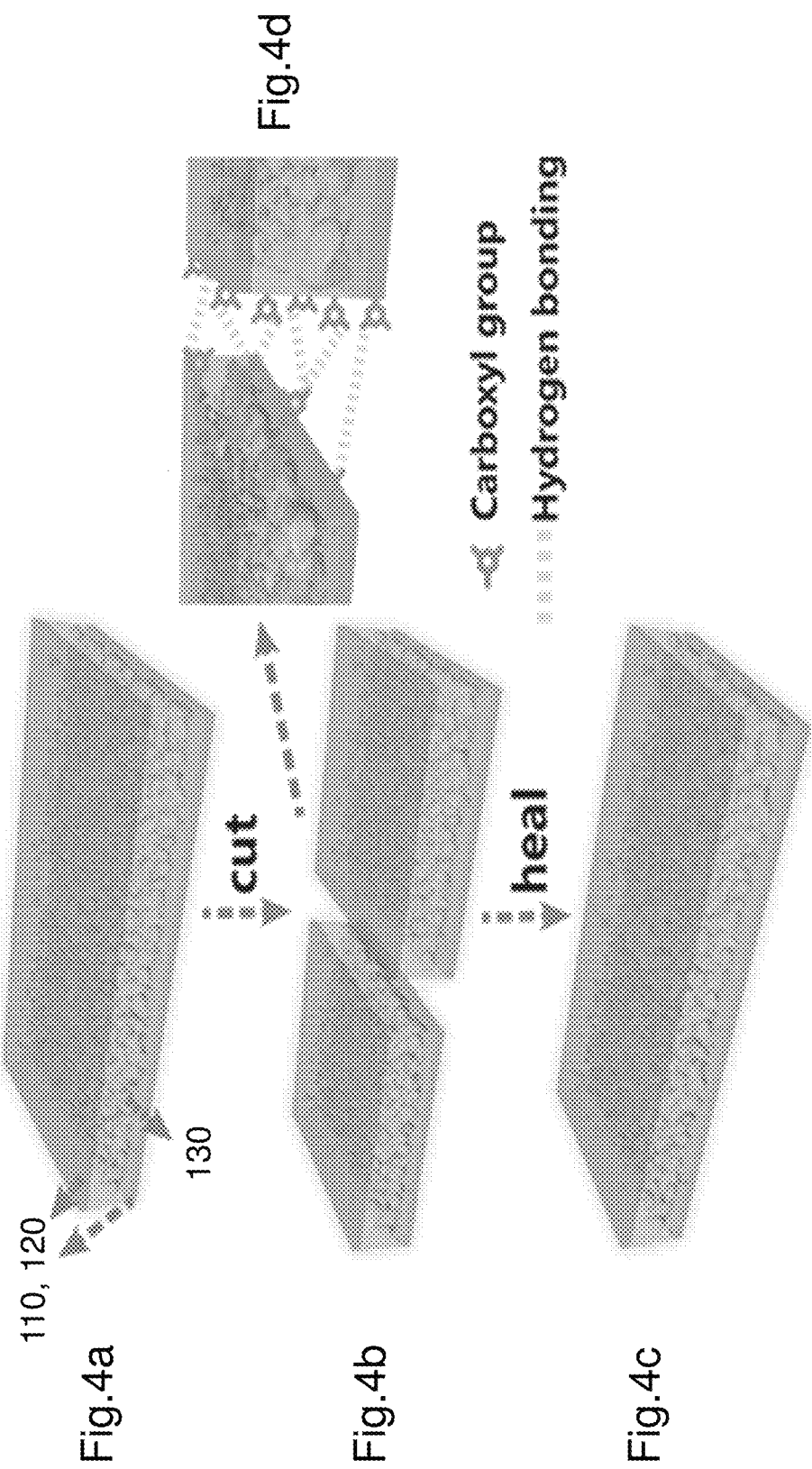

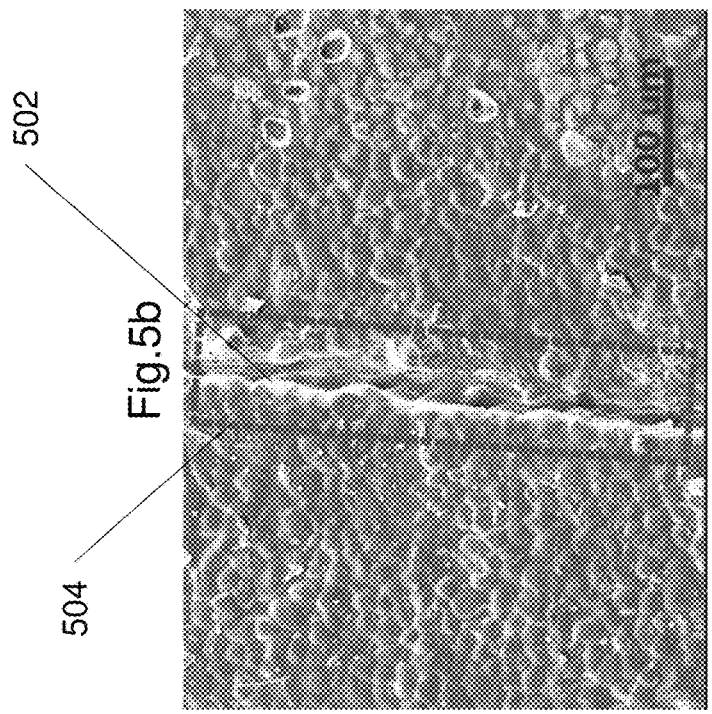
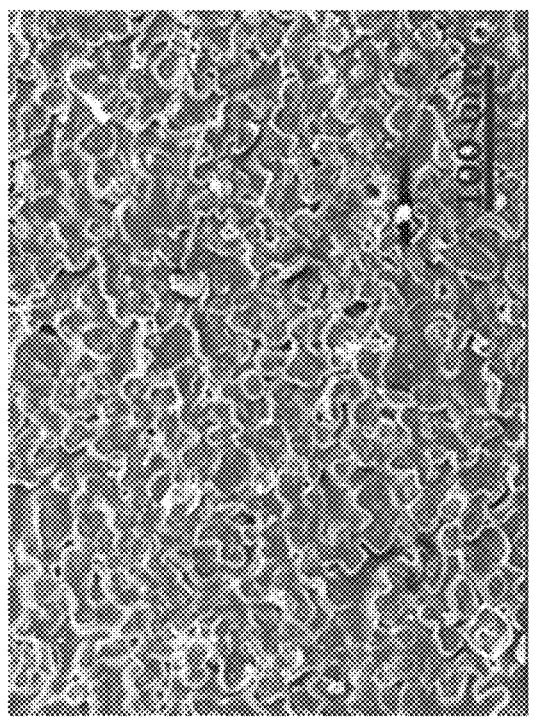
Fig.5b
Fig.5a

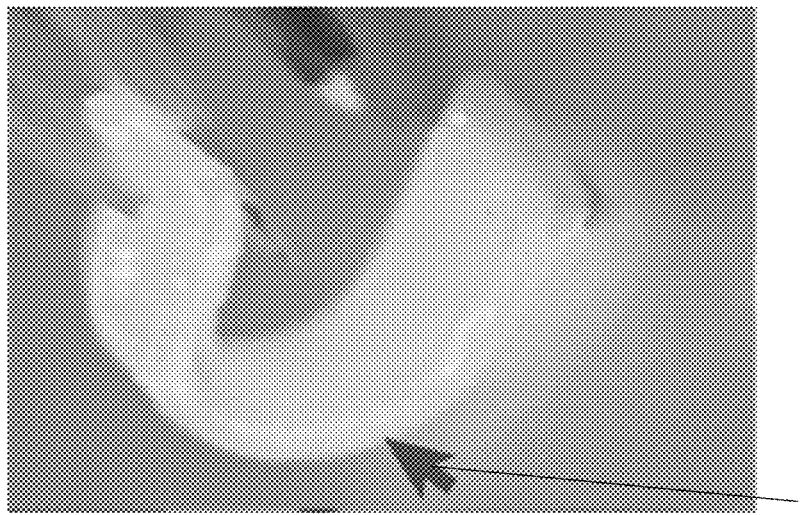
Fig.10d
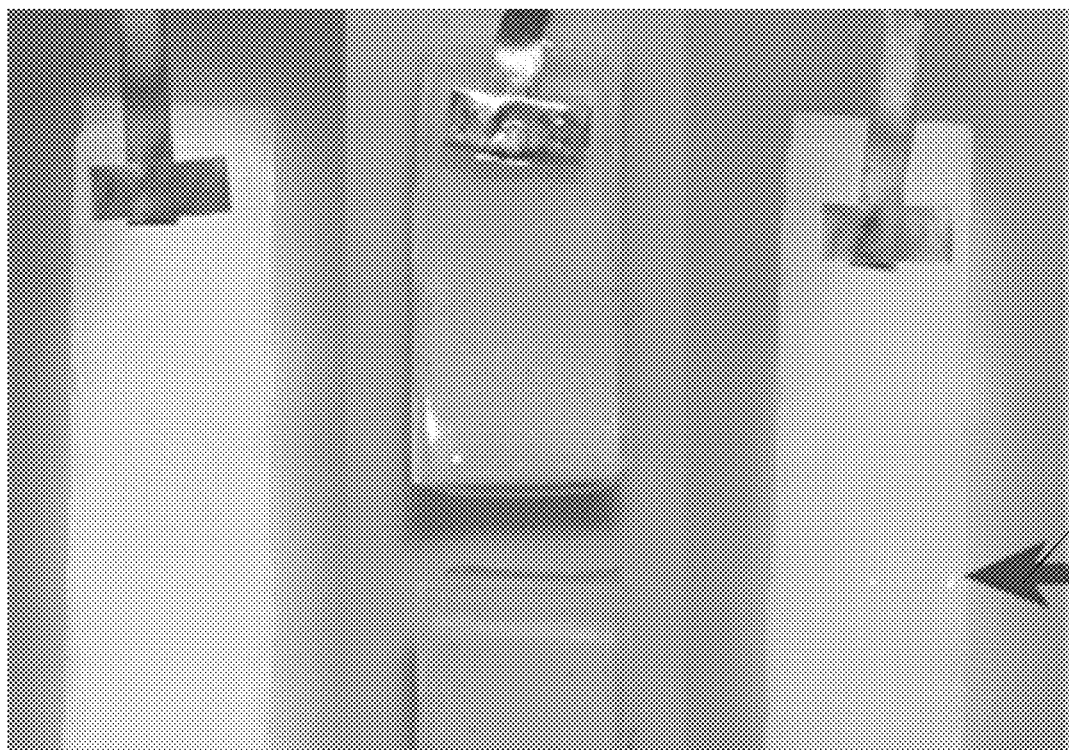
Fig.10a
Fig.10b
Fig.10c

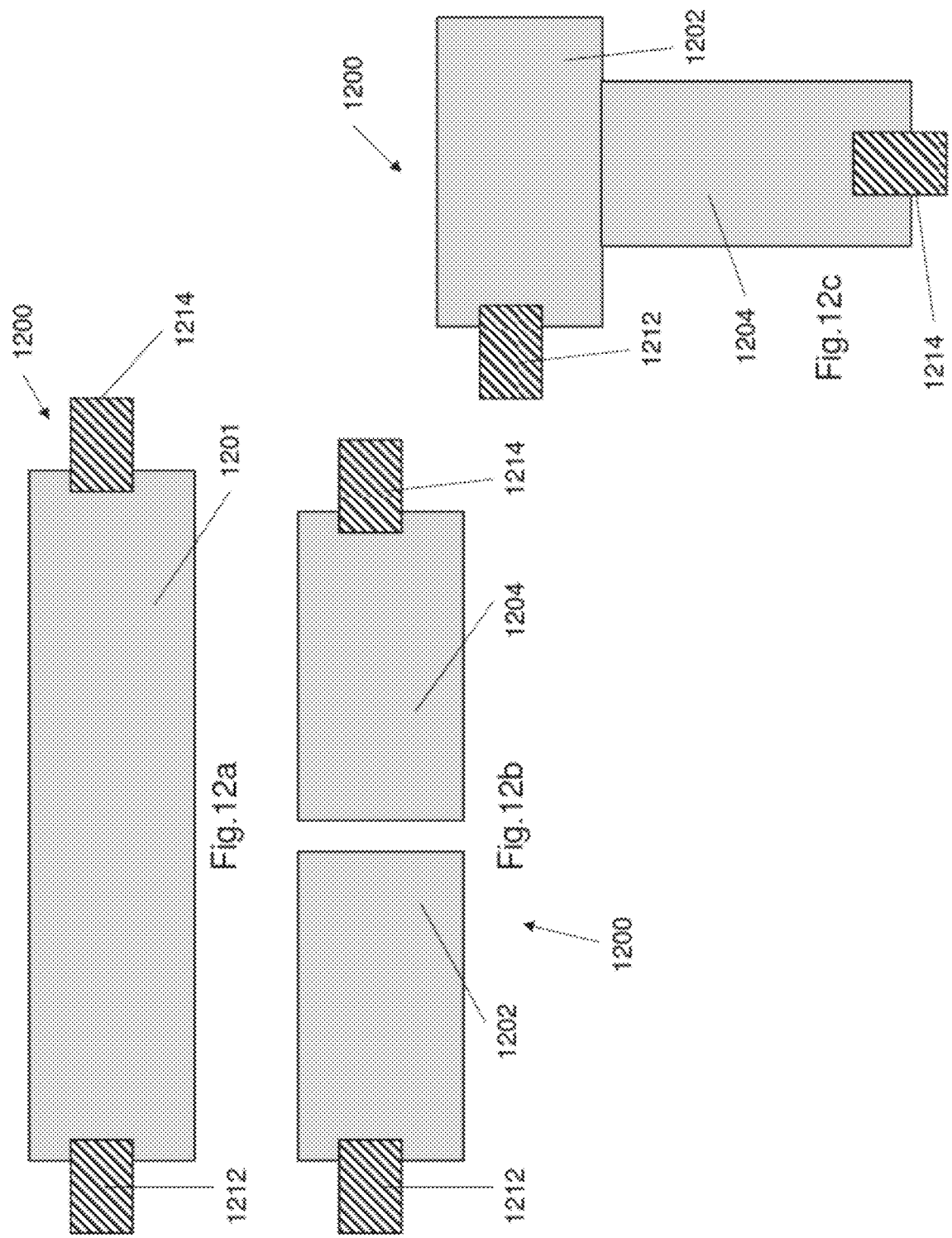

ELECTROLUMINESCENT DEVICE AND A LIGHT EMITTING SYSTEM

TECHNICAL FIELD

The present disclosure relates to a light emitting device, in particular but not limited a robust electroluminescent device that is adaptable and operable in response to mechanical loading.

BACKGROUND

Light emitting devices are used in a number of different industries and different applications. LEDs (light emitting diodes) are one example of commonly used light emitting devices. Electroluminescent (EL) devices are another example of commonly used light emitting devices. Electroluminescent (EL) devices have been developed as indispensable elements in sophisticated electronic systems, for example, the emitting light can serve as backlighting source in car control panel. EL devices have been developed and applied to various industries such as bio-inspired soft robotics for visual disguise, artificial skin actuators, flexible and stretchable electronics, wearable electronics, digital displays and flexible sensors.

The primary concern in utilizing EL devices, for example in applications such as flexible and stretchable electronic systems is the stress due to mechanical deformations and the concomitant damages. This can cause failure of the device due to strain exceeding the withstanding limit of the EL device. In addition, maintaining and replacing a dysfunctional component in a multifunctional integrated electronic system is either intractable or costly. There is a need for EL devices that can be adaptable and operable in response to mechanical loading to reduce the need to replace EL devices, such as example in multifunctional integrated electronic systems.

SUMMARY OF THE INVENTION

It is an advantage of the present invention to provide a light emitting device, in particular an electroluminescent device that can respond to mechanical loading, or at least provide the public with a useful alternative.

Other advantages of the invention (or other inventions) may become apparent from the following description and drawings, which is given by way of example only.

In accordance with a first aspect the present invention relates to an electroluminescent device comprising:

an electrode, the electrode being ionically conductive an electroluminescence layer positioned adjacent or in contact with the electrode, the electroluminescence layer being electrically coupled to the electrode, the electroluminescence layer receiving electrical energy from the electrode and illuminating in response to received electrical energy, and;

wherein the electrode and the electroluminescence layer are repairable such that the function of the electrode and the electroluminescence layer is restored after deformation.

In an embodiment the electrode and the electroluminescence layer each are repairable such that the function of the electrode and the electroluminescence layer is restored even after being cut.

In an embodiment the electroluminescence device comprises a first electrode, a second electrode, the electroluminescence layer being sandwiched between the first electrode and the second electrode and the electroluminescence layer arranged in electrical communication with the first electrode and the second electrode.

In an embodiment the electroluminescence layer comprises a polymer and an electroluminescent material, wherein the electroluminescent material comprises luminescent centres such as zinc sulphide, dielectric polymer host-binder such as polyurethane, dielectric enhancement additive such as boron nitride.

In an embodiment the electroluminescent material comprises a metal sulphide.

In an embodiment the metal sulphide comprises a zinc sulphide.

In an embodiment the electroluminescent material comprises a mixture of zinc sulphide and a boron nitride.

In an embodiment the polymer comprises polyurethane.

In an embodiment the first electrode and second electrode each comprise an ionically conductive hydrogel and a metal conductor coupled to the ionically conductive hydrogel.

In an embodiment the ionically conductive hydrogel comprises an acrylic acid and a salt mixed into the hydrogel.

In an embodiment the hydrogel comprises a polyacrylic acid (PAA) and a sodium chloride (NaCl) salt mixed with the polyacrylic acid.

In an embodiment the first electrode and second electrode are substantially transparent to allow transmittance of light from the electroluminescence layer outwardly.

In an embodiment the first electrode and the second electrode comprise greater than 96% average transmittance in the range of visible light.

In an embodiment the first electrode, second electrode and the electroluminescence layer are self-repairable such that the function of the electrode and the electroluminescence layer is restored after a deformation, such as a deformation by reforming hydrogen bonds between two adjacent polymer portions.

In an embodiment the hydrogel of each electrode is self-repairable and the polymer in the electroluminescence layer is self-repairable.

In an embodiment the hydrogel is configured to self-repair by reforming hydrogen bonds and/or covalent bonds between two adjacent hydrogel portions, and the polymer is configured to self-repair by reforming hydrogen bonds and/or covalent bonds between two adjacent polymer portions.

In an embodiment the electroluminescence device is self-repairable after the device is cut such that the function, mechanical and physicochemical properties of the electroluminescence device are restored and the structure of the electroluminescence device is restored when the cut portions are positioned adjacent each other or positioned in contact with each other.

In an embodiment the electroluminescence device is configured to spontaneously self-repair once two cut portions of the electroluminescence device are positioned adjacent each other or positioned in contact with each other.

In an embodiment the first electrode and second electrode each comprise a layer of ionically conductive metal disposed on the hydrogel to form an electrical double layer on each of the first electrode and second electrode.

In accordance with another aspect, the present invention relates to an electroluminescent device comprising:

a multi-layer structure, the multi-layer structure comprising a first electrode, a second electrode and a electroluminescence layer, the electroluminescence layer being sandwiched between the first electrode and the second electrode, the first electrode and second electrode each including a hydrogel and an electrically conductive metal disposed in contact with the hydrogel, the electroluminescence layer comprising a polymer and a metal sulphide, the first electrode and second electrode arranged in electrical communication with the electroluminescence layer, the electroluminescence layer configured to emit light in response to receiving electrical energy, the first electrode and second electrode each are ionically conductive and optically transparent, and at least one electrode and the electroluminescence layer configured to be self-repairable in response to mechanical strain and/or physical separation of electroluminescent device such that mechanical properties and physicochemical properties of the electrode and the electroluminescence layer are restored.

In an embodiment the self-repair of at least one electrode and the electroluminescence layer occurring by a mechanism of restoring hydrogen or covalent bonds between adjacent portions of the at least one electrode and adjacent portions of the electroluminescent layer.

In an embodiment the electroluminescent device is configured to self-repair after being cut or separated into at least two portions, such that two portions can be repaired such that the mechanical properties and physicochemical properties of the electroluminescent device are restored.

In an embodiment the first electrode and the second electrode each comprise a hydrogel with one or more dissoluble salts.

In an embodiment the first electrode and the second electrode each comprise a polyacrylic acid (PAA) hydrogel and sodium chloride mixed therein.

In an embodiment the electroluminescence layer comprises a polymer, and a nitride component and an electroluminescence material being dispersed onto the polymer, the electroluminescence material being a material that emits light in response to receiving electrical energy.

In an embodiment the polymer comprises a polyurethane matrix, the nitride component comprises hydroxylated boron nitride nanosheets disposed onto or within the polyurethane matrix and the electroluminescence layer comprises zinc sulphide particles disposed onto or within the polyurethane matrix.

In an embodiment the electroluminescence material comprises a phosphor composite.

In an embodiment first electrode and the second electrode are structured to have 96% average transmittance in the range of visible light.

In an embodiment the electroluminescent device is flexible about at least one axis and self-repairable after being cut into two or more pieces.

In an embodiment the hydrogel comprises a polymer matrix and the polymer matrix comprising at least two crosslink structures, the crosslink structures configured to dissipate energy received from mechanical loads applied to the electroluminescence device.

In an embodiment the crosslink structures comprise an covalent and hydrogen-bonding crosslink structure that includes a covalent crosslink structure that includes covalent bonds or hydrogen bonds.

In an embodiment the covalent and hydrogen bonding crosslink structure is configured to dissipate energy when electroluminescent device is subjected to mechanical loads by rupturing the covalent and hydrogen bonds within the covalent and hydrogen bonding crosslink structure and restore the hydrogen bonds when the electroluminescent device is unloaded; and the hydrogen bonding crosslink structure is configured to provide a bridging structure to maintain the physical boundaries of each electrode.

In an embodiment the electroluminescent device is flexible in response to one or more of bending loads, torsion loads, tensile loads and compression loads, the electroluminescent device is flexible such that function of the electroluminescence device is maintained in response to any one or more of the loads.

In an embodiment the electroluminescent device is flexible in response to all of the loads such that function of the electroluminescence device is maintained in response to all of the loads.

In accordance with a further aspect the present invention relates broadly to a method of forming an electroluminescent device, the method comprising the steps of:

synthesizing a first electrode, synthesizing a second electrode, formulating an electroluminescence layer, cleaning the electroluminescence layer, sandwiching the electroluminescence layer between the first electrode and second electrode, disposing an electrical conductor on the first electrode and second electrode, and;

wherein at least one electrode and the electroluminescence layer are configured to be self-repairable in response to mechanical strain and/or physical separation of electroluminescent device such that mechanical properties and physicochemical properties of the electrode and the electroluminescence layer are restored.

In an embodiment the first electrode and second electrode are identical to each other in construction and synthesized by the same method.

In an embodiment the first electrode and second electrode each comprise a hydrogel, the hydrogel further comprising polyacrylic acid (PAA) hydrogel and sodium chloride mixed therein.

In an embodiment the first electrode and the second electrode are formed from a single hydrogel structure by cutting the hydrogel to define the first electrode and second electrode.

In an embodiment the first electrode and second electrode are synthesized by a method of synthesizing an electrode comprising the steps of:

mixing an acrylic acid and sodium chloride in deionized water to create a solution, adding a thermal initiator into the solution, adding a cross linker into the solution, degassing the solution within a vacuum chamber, curing the solution for a predetermined time period at a predetermined temperature to form a hydrogel, cutting the hydrogel into the first electrode and second electrode.

In an embodiment N,N-methylenebisacrylamide (MBAA) is the cross linker and ammonium persulfate (APS) as the thermal initiator.

In an embodiment the predetermined time is at least 40 minutes and the predetermined temperature is at least 70 degrees Celsius.

In an embodiment the step of formulating the electroluminescence layer comprises the steps of:

providing urethane, adding boron nitride nanosheets to the urethane to form a mixture, adding zinc sulphide powder to the mixture, stirring the mixture for a predetermined time, curing the mixture in a mould for a set time and at a set temperature, wherein curing forms a matrix that defines the electroluminescence layer.

In an embodiment the set time is at least 12 hours and the set temperature is at least 40 degrees Celsius.

In accordance with a further aspect, the present invention relates to a light emitting system comprising:
a modular arrangement of electroluminescent devices,
each electroluminescent device being positionable in a location relative to the other electroluminescent devices,
each of the electroluminescent device configured to be to be self-repairable in response to mechanical strain and/or physical separation of electroluminescent device such that mechanical properties and physicochemical properties are restored.

In an embodiment each of the electroluminescent devices are coupled together to define the light emitting system, wherein each electroluminescent device comprises a first electrode, a second electrode and an electroluminescence layer sandwiched between the first and second electrodes.

In an embodiment the first and second electrodes comprise a polyacrylic acid and salt based hydrogel and the electroluminescence layer comprises a polymer matrix with dispersed electroluminescence material.

In an embodiment each of the electroluminescent devices are coupled together by using the self-repair function of the electroluminescent devices.

In an embodiment the electroluminescent devices are coupled together by forming hydrogen bonds between adjacent electrode layers of adjacent electroluminescent devices and forming hydrogen bonds between adjacent electroluminescent layers of adjacent electroluminescent devices.

In an embodiment the electroluminescent devices are formed by cutting a larger electroluminescent device into smaller electroluminescent devices.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

As used herein the term 'and/or' means 'and' or 'or', or where the context allows both.

The invention consists in the foregoing and also envisages constructions of which the following gives examples only. In the following description like numbers denote like features.

As used herein "(s)" following a noun means the plural and/or singular forms of the noun.

In the following description, specific details are given to provide a thorough understanding of the embodiments. However, it will be understood by one of ordinary skill in the art that the embodiments may be practiced without these specific details. For example, well-known modules, structures and techniques may not be shown in detail in order not to obscure the embodiments.

Also, it is noted that at least some embodiments may be described as a method (i.e. process) that is depicted as a flowchart, a flow diagram, a structure diagram, or a block diagram. Although a flowchart may describe the operations as a sequential method, many of the operations can be performed in parallel or concurrently. In addition, the order of the operations may be rearranged. A method (i.e. process) is terminated when its operations are completed.

In this specification, the word "comprising" and its variations, such as "comprises", has its usual meaning in accordance with International patent practice. That is, the word does not preclude additional or unrecited elements, substances or method steps, in addition to those specifically recited. Thus, the described apparatus, substance or method may have other elements, substances or steps in various embodiments. The term "comprising" (and its grammatical variations) as used herein are used in the inclusive sense of "having" or "including" and not in the sense of "consisting only of".

BRIEF DESCRIPTION OF THE DRAWINGS

Notwithstanding any other forms which may fall within the scope of the present disclosure, a preferred embodiment will now be described, by way of example only, with reference to the accompanying drawings in which:

FIGS. 4a to 4d illustrate a cut and self-repair process of the EL device of FIG. 1.

FIGS. 5a and 5b show scanning electron microscope (SEM) images of the electroluminescence layer

FIGS. 10a to 10d illustrate photos of en electroluminescent device prior to being cut, being cut, repaired and bent and the luminescence in each of these states.

FIGS. 12a to 12c show figures of a light emitting system formed by cutting an electroluminescence device into multiple pieces.

DETAILED DESCRIPTION OF A PREFERRED EMBODIMENT

The primary concern in utilizing EL devices, for example in applications such as flexible and stretchable electronic systems is the stress due to mechanical deformations and the concomitant damages. This can cause failure of the device due to strain exceeding the withstanding limit of the EL device. In addition, maintaining and replacing a dysfunctional component in a multifunctional integrated electronic system is either intractable or costly. There is a need for EL devices that can be adaptable and operable in response to mechanical loading to reduce the need to replace EL devices, such as example in multifunctional integrated electronic systems.

The present disclosure generally relates to a robust electroluminescent device (EL device) that can respond to mechanical loading, and is adaptable and operable in response to mechanical loading. In particular the electroluminescent device (EL device) is flexible and is self-repairable (i.e. self-healable), such that its structural properties, physicochemical properties and luminance can be restored after deformations such as cutting the device. The present disclosure further relates to a method of forming an electroluminescent device (EL device) that can self-repair (i.e. self-heal) and is adaptable in response to mechanical loads. The present disclosure also relates to a light emitting system comprising a plurality of electroluminescent devices (EL devices) that are removably connectable to each other. The electroluminescent devices are interconnectable to each other thereby allowing a user to create various shapes and configurations.

Electroluminescent devices are devices that operate on the principle of electroluminescence. Electroluminescence is the phenomenon in which a material emits light in response to the passage of an electric current (i.e. electric energy) or to a strong electric field. An electroluminescent device (EL device) includes an electroluminescent material that is configured to emit light in response to receiving electrical energy (i.e. receiving electrical current). The colour of an electroluminescent device (EL device) may be altered by adding phosphor to absorb the light emitted by the electroluminescent material and re-emit photons having a particular wavelength based on the composition of the phosphor. Electroluminescent devices may comprise a semiconductor material or a phosphor compound that emits light.

In one general configuration an EL device comprises at least one electrode layer and an electroluminescence layer attached to the electrode layer. The electrode layer is formed of an ionically conductive material and is configured to conduct electricity (i.e. electrical energy) to the electroluminescence layer. The electroluminescence layer comprises a material that illuminates when exposed to electricity i.e. electrical energy such as for example a phosphor based material or a sulphide.

Figure 1:
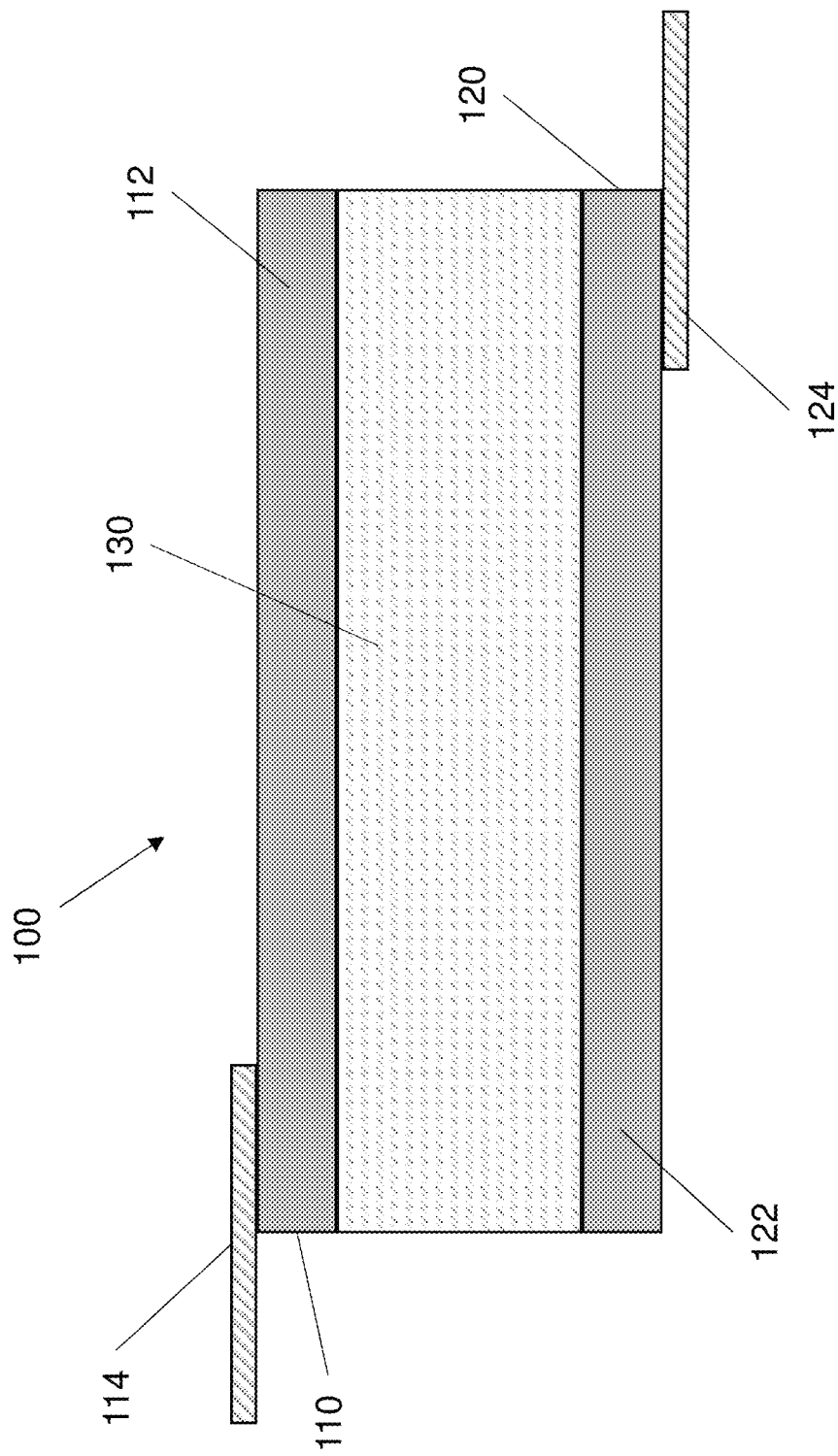
FIG. 1 shows an exemplary configuration of an electroluminescent device (EL device) in accordance with the present invention.

FIG. 1 shows an exemplary configuration of an electroluminescent device 100 (i.e. EL device). The EL device 100 is adaptable to mechanical loading such that it maintains functionality in response to various mechanical loads. The EL device 100 is also substantially flexible along at least one axis. Preferably the EL device 100 is flexible in response to one or more of bending loads, torsion loads, tensile loads and compression loads, the electroluminescent device is flexible such that function of the electroluminescence device is maintained in response to any one or more of the loads. More preferably EL device 100 is flexible in response to all of the loads such that function of the electroluminescence device is maintained in response to all of the loads.

The EL device 100 comprises a multi-layer structure. The EL device 100 may comprise a laminate multi-layer structure where the layers are attached to form a unitary structure. FIG. 1 shows an example configuration of the EL device multi-layer structure 102.

Referring to FIG. 1, the EL device 100 comprises a first electrode 110, a second electrode 120 and an electroluminescence layer 130 forming the multi-layer structure 102. The first electrode 110 and the second electrode 120 may be substantially identical to each other. The first electrode 110 and the second electrode 120 are ionically conductive. The electroluminescence layer 130 is arranged in electrical communication with the first electrode 110 and the second electrode 120.

The first electrode 110 and the second electrode 120 each comprise a multi-layer structure, according to the exemplary configuration shown in FIG. 1. As shown in FIG. 1, the first electrode 110 comprises an ionically conductive hydrogel 112 and a metal conductor 114 coupled to the ionically conductive hydrogel 112. The hydrogel 112 and the metal conductor 114 form separate layers that define the first electrode. The second electrode 120 is substantially identical in construction to the first electrode 110.

Referring again to FIG. 1, the second electrode 120 comprises an ionically conductive hydrogel 122 and a metal conductor 124 disposed on the hydrogel 120. The hydrogel 122 and metal conductor 124 form a multi-layer structure defining the second electrode 120. In the first electrode 110 and the second electrode the metal conductor is coupled to the hydrogel such that the hydrogel and the metal conductor are in electrical communication with each other. The metal conductors 114 and 124 may be constructed from aluminium.

The metal conductor being attached to the hydrogel results in an electrical double layer. The area of the metal conductor is only a small portion of the entire area of the hydrogel (112, 122). The small area of the metal conductor on the hydrogel (112, 122) ensures stability of the hydrogel by avoiding interfacial electrochemical reactions.

The hydrogel (112, 122) of each of the first and second electrodes comprises an acrylic acid and a salt mixed into the hydrogel. The mixed salt contributes to the ionic conductivity of the hydrogel since the salt helps to conduct electricity. The salt may be dissolved within the hydrogel. In the illustrated example the hydrogel (112, 122), of each electrode comprises a polyacrylic acid (PAA) and a sodium chloride (NaCl) salt mixed within the PAA. The hydrogel is a preferably substantially flexible and has a gel like consistency that can support other solid objects. The PAA chains are held together by hydrogen bonds between each of the PAA chains.

The electroluminescence layer 130 comprises a polymer and an electroluminescent material. The electroluminescent material may be any suitable material. In the illustrated configuration of FIG. 1 the electroluminescent material is a metal sulphide. More specifically the metal sulphide is a Zinc sulphide (ZnS) compound. The Zinc sulphide is preferably a Zinc sulphide phosphor compound. For example the ZnS may be doped with some suitable amount of phosphor. The ZnS compound includes electroluminescent functionality. ZnS illuminates (i.e. generates photons) in response to receiving electrical energy from an electric current. The electroluminescent material also comprises a nitride material, in the illustrated configuration the nitride compound is a boron nitride (BN).

The polymer is preferably a urethane polymer. In the illustrated configuration, the polymer is a polyurethane material. The polyurethane may be a sheet and preferably provides a matrix upon which hydroxylated boron nitride nanosheets and ZnS particles are physically dispersed. In some configurations the boron nitride is formed as nanosheets, and the ZnS nanoparticles are bound within or mixed within the polyurethane matrix. More specifically the electroluminescence layer may be formed as two stratified parts. In a lower part, ZnS particles are stacked and the BN nanosheets are bound by the polyurethane located in the interstitial spaces among ZnS particles. In the upper part the BN nanosheets are dispersed uniformly in the polyurethane matrix.

Alternatively the boron nitride nanosheets and the ZnS particles may be dispersed on the polyurethane sheet. The polyurethane matrix comprises a plurality of polyurethane chains that are bonded together by hydrogen bonds.

Figure 2:
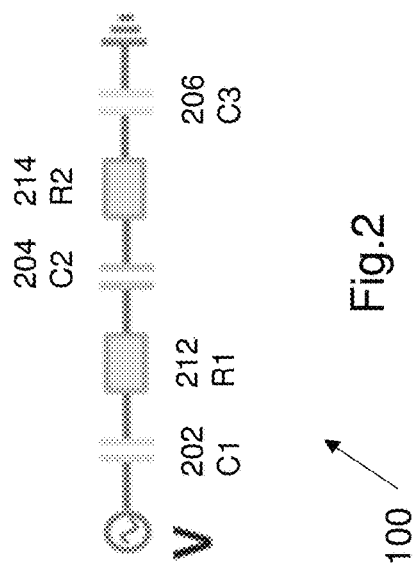
FIG. 2 illustrates an electrical circuit that is used to model the EL device of FIG. 1

FIG. 2 illustrates an electrical circuit 200 that is used to model the EL device 100. The first electrode 110, the second electrode 120 and the electroluminescence layer 130 all behave like capacitors in series. The first capacitor 202 is the electric double layer (EDL) between the first metal conductor 114 and the first hydrogel 112, in the first electrode 110. The first resistor 212 is the resistance of the first hydrogel 112. The second capacitor 204 is the capacitor formed by the first electrode 110, second electrode 120 and the electroluminescent layer 130. The second resistor 214 is the resistance of the second hydrogel 122. The third capacitor 206 is defined by the electric double layer (EDL) between the second metal conductor 124 and the second hydrogel 122. In order to evaluate the performance of the circuit, these capacitors are assumed to be linear. The electrical circuit 200 can be defined as $Q=C_1V_1=C_2V_2=C_3V_3$, where Q is the charges and C, V respectively represent the corresponding capacitance and voltage of each layer. The capacitance of the electroluminescence layer is lower than the capacitance of the EDL layers in the first and second electrodes in a lower frequency range, i.e. the second capacitor 204 has a lower capacitance than the first capacitor 202 and the third capacitor 206. This causes the charge to be concentrated on the electroluminescence layer. In addition the net capacitance of the circuit 200 is dominated by the first capacitor 202 and the third capacitor 206.

The small contacting area between the metal conductor and the adjacent hydrogel functions as an electric double layer (EDL) and the electroluminescence layer functions as a capacitor too, as discussed earlier. In one example the first and third capacitors may have a capacitance of approximately $10^{-1}$ F m$^{-2}$. The second capacitor (i.e. the electroluminescence layer) can have a capacitance of approximately $10^{-7}$ F m$^{-2}$. From the equation above defining charge, it can be seen that majority of the charge is distributed on the electroluminescence layer since it has the smallest capacitance. The luminance of the electroluminescence layer is determined by the applied voltage on the particles of the electroluminescence layer.

Figure 3:
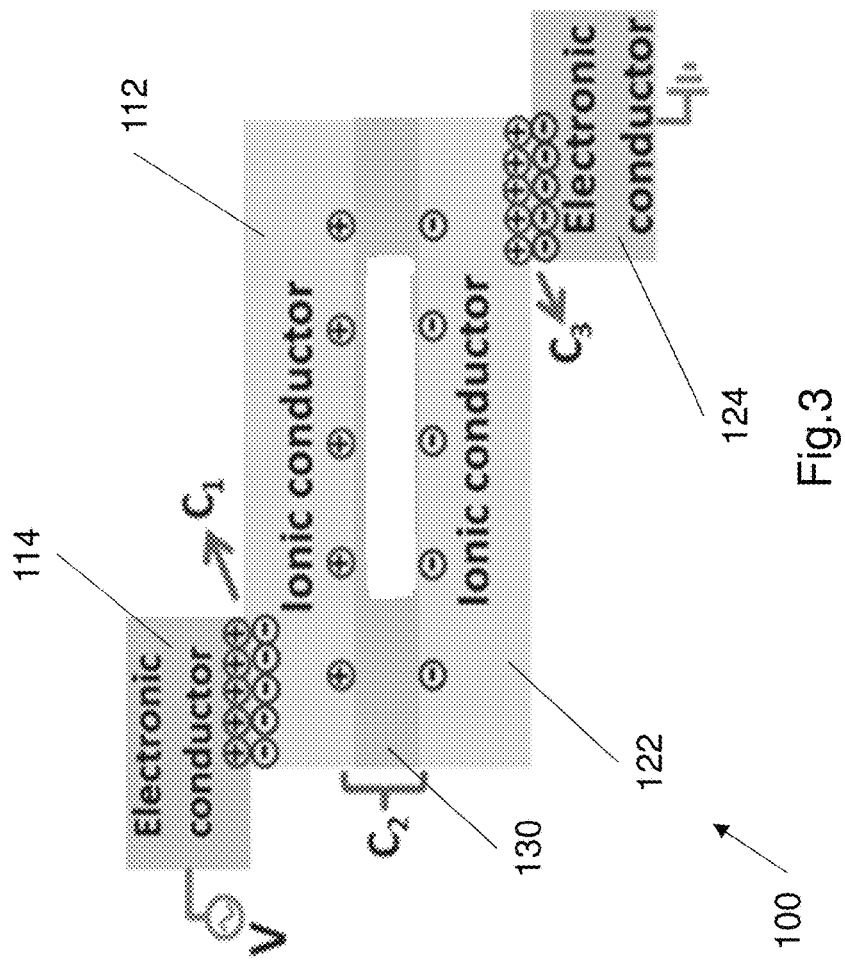
FIG. 3 shows an example of the charge distribution across the electroluminescent device of FIG. 1.

FIG. 3 shows an example of the charge distribution across the electroluminescent device 100. As shown in FIG. 3 majority of the charge is concentrated around capacitor 202 and capacitor 206, due to the larger capacitance value of these capacitors. The capacitor 204 still attracts some charge. The electricity (i.e. charge) in the electroluminescence layer causes the electroluminescence layer to illuminate. The emitted light is a result of the recombination of excitons within the intrinsic heterojunction of the ZnS powders under an alternating current electric field, while the light wavelength is tuned by the dopants in the ZnS compound e.g. in the ZnS lattice.

The electrical and electro-optical characteristics of the electroluminescence layer are determined by the composition of the electroluminescence layer 130 and the emission wavelength is determined by the luminescent centre, such as doped elements and defects. Applied by the high electric field, the electrons on the luminescent centres was driven into excited states by the excited ballistic energy electrons with impact excitation and the radiative relaxation of the luminescent centre subsequently occurred. This is the basic process of light emission for the electroluminescence layer 130.

As described earlier the ZnS particles are embedded within and/or dispersed upon the polyurethane (PU) material which can block electrons to tunnel through the dielectric layer i.e. the layer formed by the two hydrogel layers sandwiching the electroluminescence layer, and prevent electrical breakdown at high electric fields. In use, the EL device is generally coupled to an external AC voltage supply to cause luminescence of the electroluminescence layer 130.

The first electrode 110 and the second electrode 120 is formed to be transparent such that light can be transmitted through the first electrode 110 and the second electrode 120 i.e. each electrode has transmittance sufficient to transmit light out of the electrode. The first electrode 110 and second electrode 120 can achieve over 96% average transmittance in the range of visible light (e.g. for wavelengths ranging from 380 nm to 800 nm). The first electrode 110 and the second electrode 120 can also achieve an ionic conductivity of over 2 S m$^{-1}$.

The EL device 100 as described herein is repairable. More particularly the EL device 100 is self-repairable (i.e. self-healable) after deformation and/or mechanical strain and/or physical separation of the EL device 100. The EL device 100 can self-repair (i.e. selfheal) such that operation and function of the EL device 100 is restored following deformation and/or mechanical strain and/or physical separation. Each component of the EL device 100 is also able to self-repair. In particular the first electrode 110, the second electrode 120 and the electroluminescence layer 130 are self-repairable such that the mechanical properties and functionality are restored. The EL device 100 is particularly advantageous because it can self-repair even once the EL device 100 has been cut into multiple pieces.

The mechanical properties and physicochemical properties of the EL device 100 are restored following self-repair after damage e.g. cutting into two or more pieces. The mechanical properties and physicochemical properties of each of the components of the EL device (i.e. the first electrode 110, second electrode 120 and the electroluminescence layer 130) are restored after self-repair. The luminescent performance of the EL device 100 is substantially recovered after self-repair. The transparency of each electrode is recovered and the luminescence of the electroluminescence layer is also recovered as part of the self-repair. The EL device is advantageous because the device recovers its function due to the self-repair ability of the EL device.

FIGS. 4a to 4d illustrate a cut and self-repair process of the electroluminescence device 100 (EL device). FIG. 4a shows the EL device 100 in an initial configuration. The EL device includes a first electrode 110, a second electrode 120 and an electroluminescence layer 130 sandwiched between the two electrodes 110, 120. The metal conductor associated with each electrode is not displayed. FIG. 4b shows the EL device 100 being cut into two pieces. The cut is applied down the middle of the EL device 100. FIG. 4c illustrates the structure of the EL device 100 after self-repair. As shown in FIG. 4c the EL device 100 self-repairs about the cut region to reform a single piece EL device 100. The restored (i.e. repaired) EL device 100 also restores its physicochemical properties i.e. the illumination properties are restored. The mechanical properties are also restored.

FIG. 4d illustrates a detailed view of the cut and the self-repair mechanism. The EL device 100 self-repairs by reforming the hydrogen bonds between the two cut portions of the EL device. More specifically the first electrode 110 reforms hydrogen bonds and/or covalent bonds between adjacent sections of the cut first electrode 110. The second electrode 120 also reforms hydrogen bonds and/or covalent bonds between adjacent sections of the cut second electrode 120. Similarly the electroluminescence layer 130 also self-repairs by reforming hydrogen bonds and/or covalent bonds between adjacent sections of the cut electroluminescence layer 130. FIG. 4d shows the restoration of the hydrogen bonds 400 between adjacent sections. The PAA chains in the first electrode and second electrode defines a skeleton of the hydrogel and helps to reform the hydrogen bonds between the carboxyl groups of the PAA chains. The electroluminescence layer 130 also reforms the hydrogen bonds 400 between the carboxyl groups of the polyurethane.

The polyurethane within the electroluminescence layer 130 contributes significantly to the mechanical properties of the electroluminescence layer 130. The electroluminescence layer comprises a greater proportion of polyurethane as compared to ZnS and BN nanosheets. The electroluminescence layer is substantially flexible in bending, torsion and shear. The electroluminescence layer is also adaptable in tension and compression. The larger proportion of polyurethane also contributes to the healability (i.e. reparability). PAA is a majority component of the first electrode 110 and second electrode 120. Each of the electrodes 110, 120 substantially flexible in bending, torsion and shear, as well as being adaptable in tension and compression. The majority component being PAA promotes self-repair.

In one example the self-repair process can be achieve by holding the two cut portions adjacent and in contact with each other. The two cut portions may be pushed against each other to facilitate the self-repair process. In a further example one or more droplets of a solvent (e.g. water and ethanol with weight ratio 1:1, ca. 5 μL) may be applied to the "wound" i.e. the cut. The solvent facilitates rebuilding of hydrogen bonds.

FIGS. 5a and 5b show scanning electron microscope (SEM) images of the electroluminescence layer 130. FIG. 5a illustrates a SEM image electroluminescence layer 130 prior to being cut. FIG. 5b shows a SEM image of the electroluminescence layer 130 after healing about a cut. The cut 502 is shown as a line. The electroluminescence layer 130 is healed around the cut to reform the layer 130 as a single piece. The healed region is shown by box 504.

Figure 6:
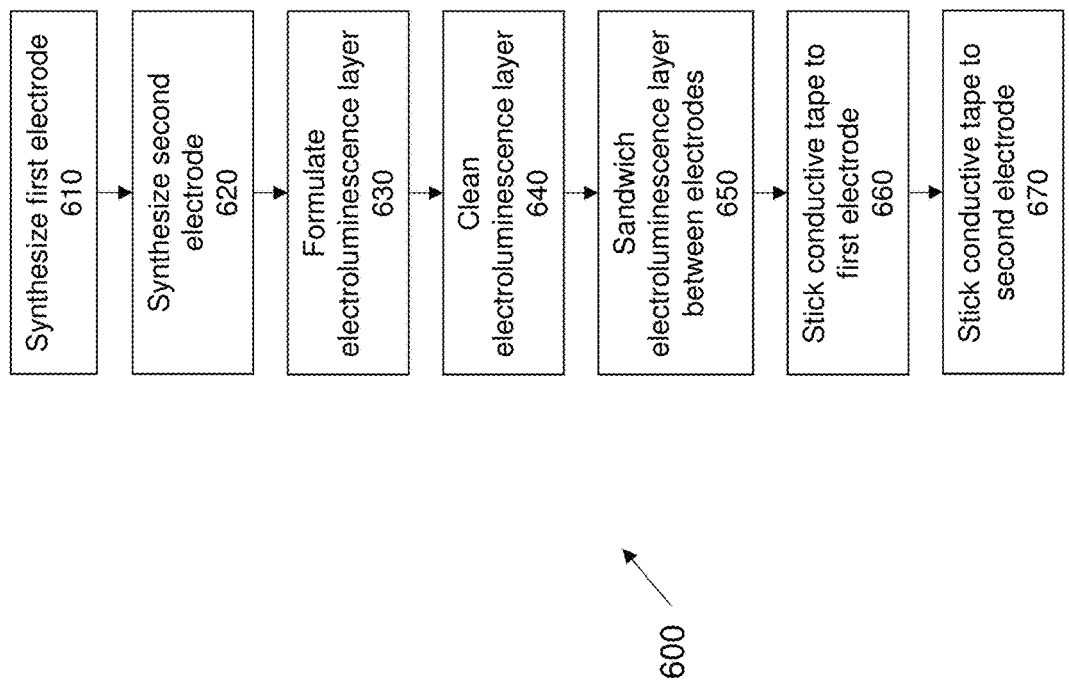
FIG. 6 shows a method of forming an electroluminescent device.

FIG. 6 shows a method 600 of forming the EL device 100. The method 600 is one exemplary method of forming the EL device 100. The method commences at step 610. Step 610 comprises synthesizing a first electrode comprising an ionically conductive hydrogel. Step 620 comprises a second electrode comprising an ionically conductive hydrogel. Step 630 comprises formulating an electroluminescence layer comprising an electroluminescence material. Step 640 comprises cleaning the electroluminescence layer by using mild flows of nitrogen gases to remove residual water on the electroluminescence layer. Step 650 comprises sandwiching the electroluminescence layer between the first electrode and second electrode. The two electrodes are adhered to the electroluminescence layer. Step 660 comprises sticking electrically conductive aluminium tape on the first electrode. Step 670 comprises sticking electrically conductive aluminium tape on the second electrode. Each of the conductive aluminium tapes are coupled to the edge of each electrode. The first and second electrodes are formed of an ionically conductive PAA hydrogel, as described earlier. The electroluminescence layer comprises a polyurethane matrix with ZnS particles and BN nanosheets dispersed within the matrix.

Figure 7A:
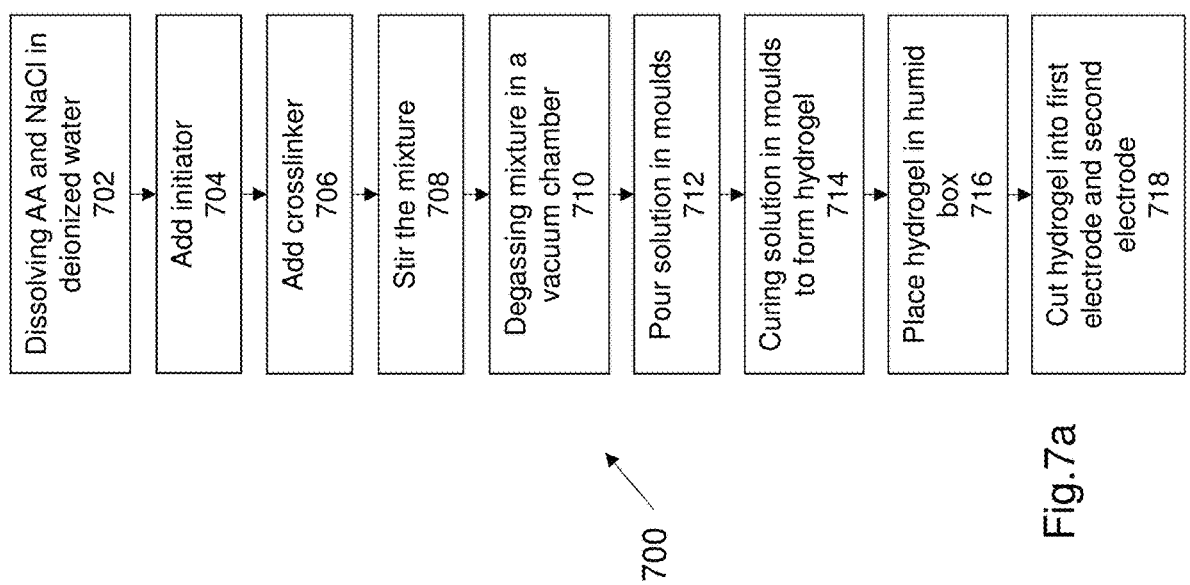
FIG. 7a illustrates a method of forming an electrode of the electroluminescent device.

FIG. 7a illustrates additional steps for synthesizing an electrode (i.e. the first and second electrode). The steps 610 and 620 from method 600, comprise the additional steps of method 700 of forming an electrode. The method 700 describes synthesizing the hydrogel that forms the first and second electrodes. The hydrogel is synthesized using an acrylic acid (AA) monomers (e.g. Acros Organics Code: 164250010), a N,N-methylenebisacrylamide (MBAA) cross linker (e.g. Aladdin, M104026) and an ammonium persulfate (APS) as a thermal initiator (e.g. Acros Organics Code: 401165000). Other cross linkers and thermal initiators may be used.

Method 700 commences at step 702. Step 702 comprises dissolving the acrylic acid (AA) and sodium chloride (NaCl) into deionized water in an ice bath. In this example the amount of AA is 5.1M and the amount of NaCl is 4M. The ratio of AA to NaCl is between 1.2 to 1.3 and preferably around 1.275. Step 704 comprises adding the APS or another thermal initiator into the solution. The amount of thermal initiator is approximately 0.0015 the weight of the AA. Step 706 comprises adding the MBAA or other cross linker. The amount of cross linker is approximately 0.0005 of the weight of the AA. Step 708 comprises stirring the mixture for at least 30 minutes. Step 710 comprises degassing the stirred mixture in a vacuum chamber. Step 712 comprises pouring the solution into moulds. The moulds are shaped to correspond to the desired shape of the electrodes. The moulds may be made of glass or any other suitable material. Step 714 comprises curing the solution within the mould at a predetermined temperature for a predetermined time. In this example the set temperature is 70 degrees Celsius and the set time is 40 mins. Curing results in the creation of a hydrogel that is ionically conductive due to the mixed salt (i.e. NaCl). Step 716 comprises placing the cured hydrogel into a humid box for 60 hours to stabilize the reaction. Step 718 comprises cutting the hydrogel into a desired shape e.g. to form two electrodes. Steps 610 and 620 comprise the method 700 to form the first electrode and second electrode.

Figure 7B:
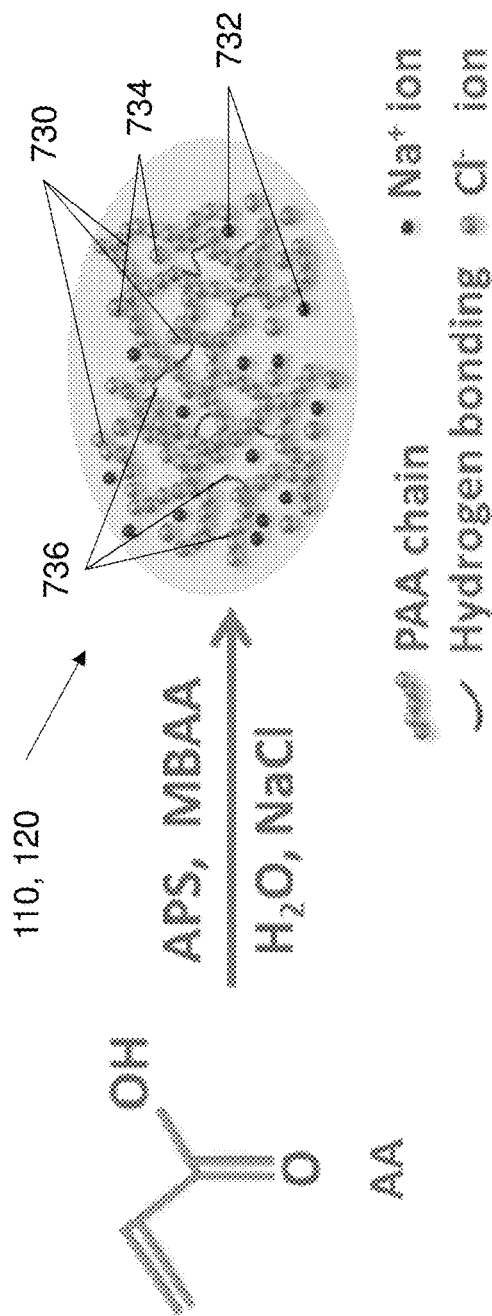
FIG. 7b shows a visual illustration of the formation of the electrode.

FIG. 7b illustrates a synthesis process of the hydrogel that forms part of each of the first and second electrodes 110, 120. FIG. 7b visually illustrates the method 700 described earlier. FIG. 7b also shows the structure of the hydrogel that includes PAA chains 730 with dissolved (and free) Na 732 ions and Cl 734 ions. The PAA chains 730 are bonded together by hydrogen bonds 736. The hydrogen bonds are restored as part of the self-repair process. The hydrogel is substantially transparent to visible light. The hydrogel is preferably formed to have at least 96% transparency to visible light.

Figure 8A:
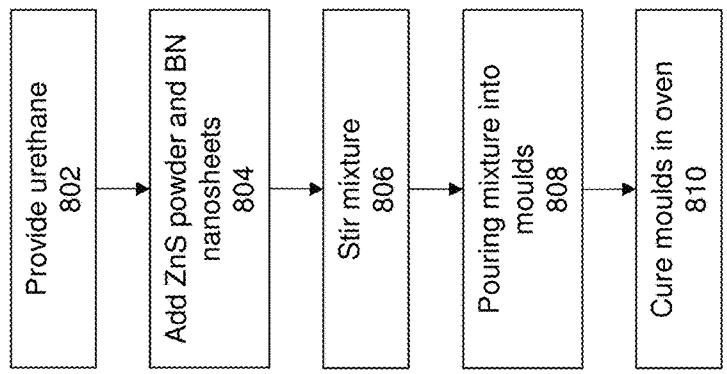
FIG. 8a illustrates a method for formulating the electroluminescence layer of an electroluminescent device.

FIG. 8a illustrates a method 800 for formulating the electroluminescence layer. Step 630 from method 600 comprises the method 800 and its steps. Method 800 commences at step 802. Step 802 comprises providing a water borne polyurethane. The urethane compound may be provided in a liquid form. Step 804 comprises adding ZnS powders and the hydroxylated BN nanosheets into the urethane liquid. In this example approximately 1 g of ZnS powder is used and 0.3 g of BN nanosheets were used. The BN nanosheets and ZnS are preferably formed using any suitable method. The urethane liquid may be hydrophilic. Step 806 comprises stirring the mixture for a set time e.g. 6 hours to obtain a uniform dispersion of ZnS powders and BN nanosheets. Step 808 comprises pouring the mixture into one or more moulds. The moulds may be glass moulds. Step 810 comprises placing the mould into an oven to cure at a set temperature and a set time. The set temperature in this example is 40 degrees Celsius and the set time is 12 hours. The curing causes water to evaporate from the polyurethane (PU) matrix. The curing forms a composite material that is the electroluminescence layer. The electroluminescence layer is sandwiched within two electrodes.

Figure 8B:
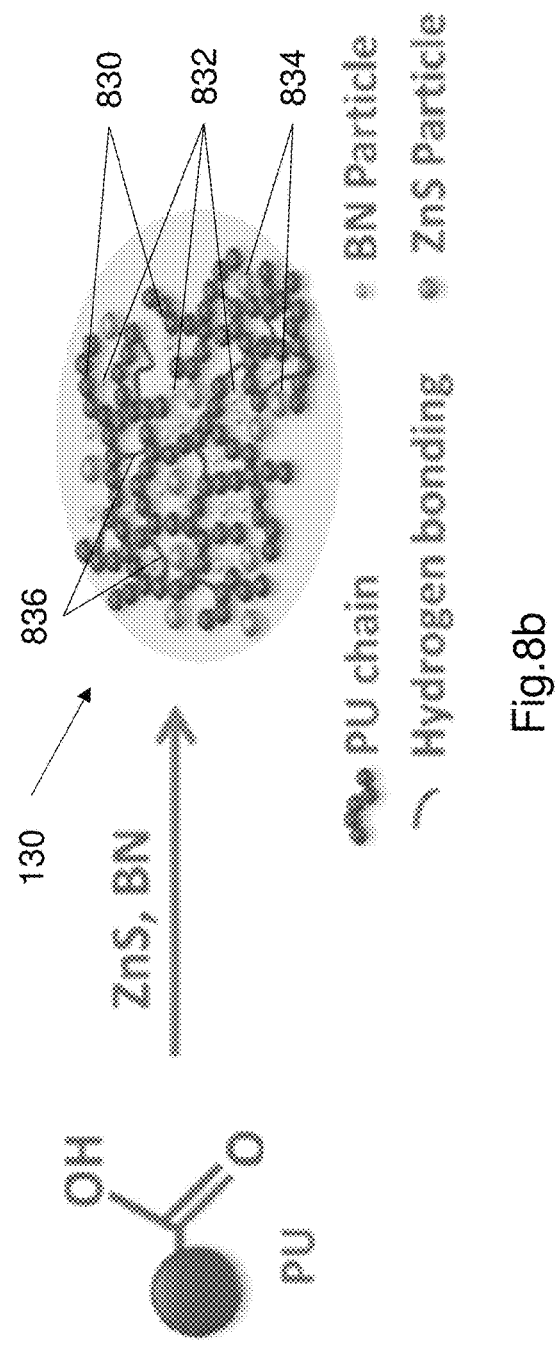
FIG. 8b shows a visual illustration of the formation of the electroluminescence layer.

FIG. 8b shows a visual illustration of the formation of the electroluminescence layer 130. As shown in FIG. 8b the electroluminescence layer is started by using a polyurethane (PU) material. As shown in FIG. 8b the electroluminescence layer comprises multiple PU chains 830. The PU chains 830 form a PU matrix. As shown in FIG. 8b the BN particles 832 and the ZnS particles 834 are dispersed on and within the PU matrix 830. The PU chains are linked together by hydrogen bonds. The hydrogen bonds 836 between the PU chains 830 are reformed during the self-repair process. The electroluminescence layer is substantially opaque when not excited by a current being applied to the electroluminescence layer 130.

Figure 9A:
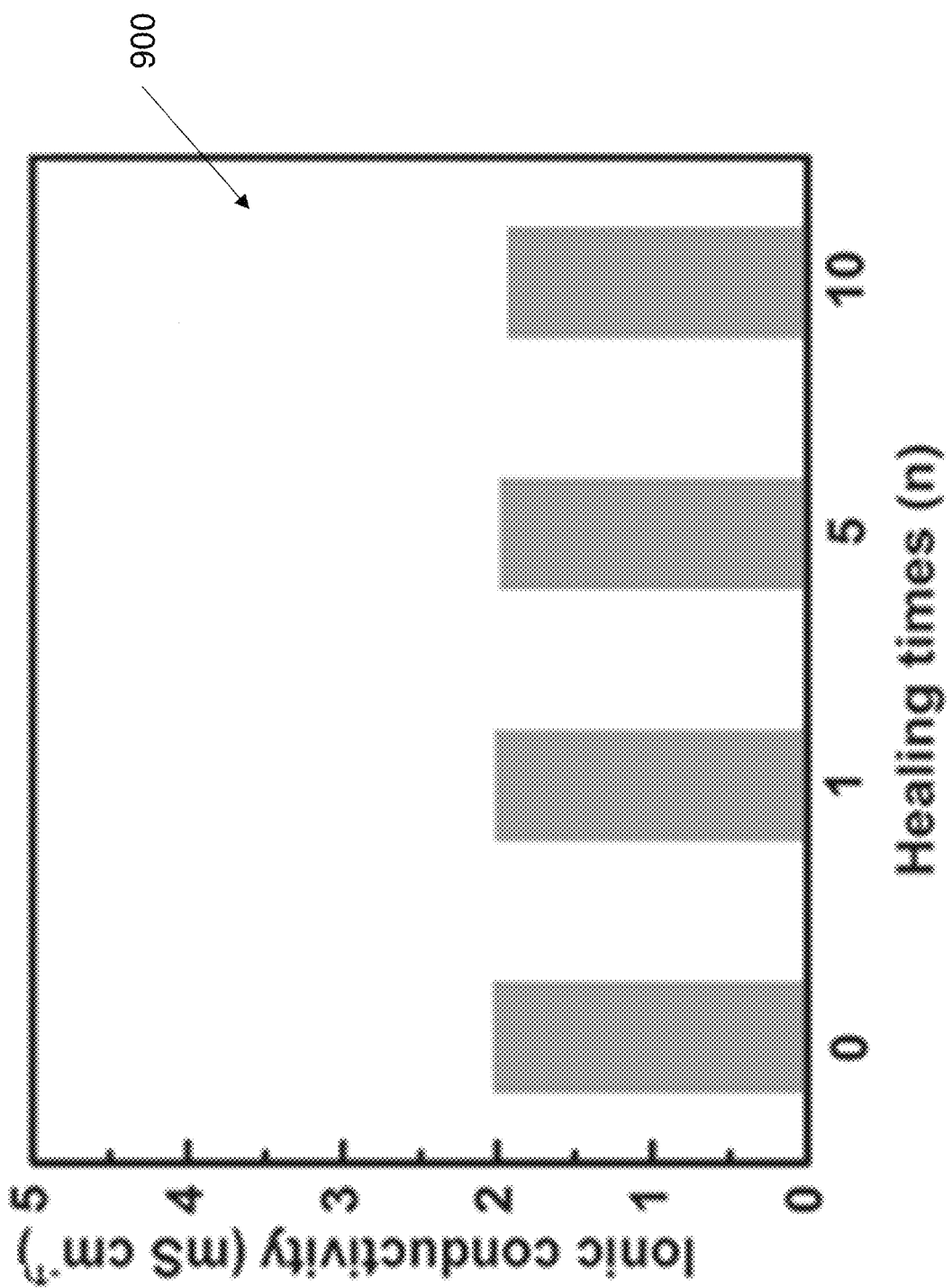
FIG. 9a shows a graph of the ionic conductivity of the PAA electrode after multiple cut and self-repairing operations.
Figure 9B:
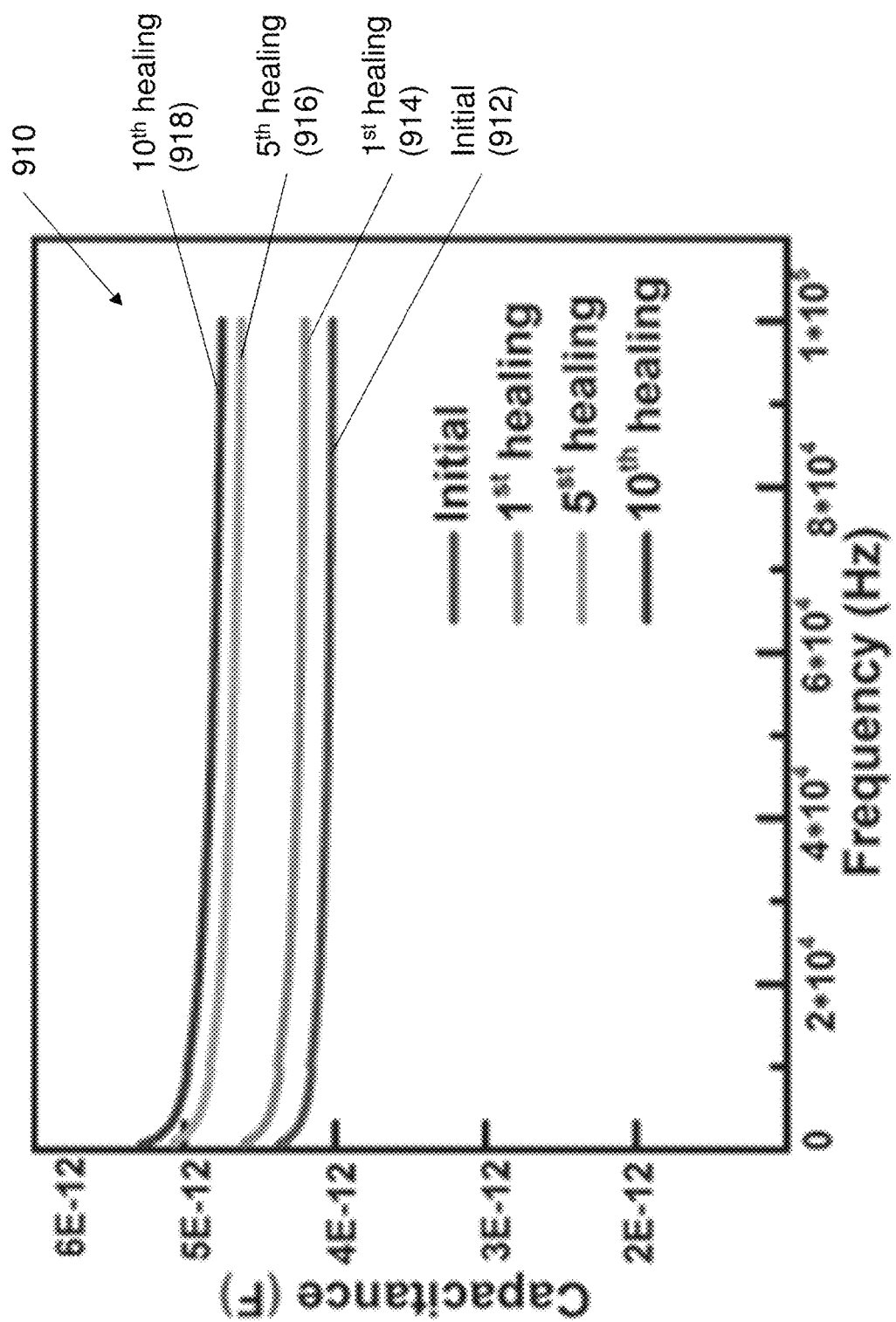
FIG. 9b shows a plot of the capacitance of the electroluminescence layer 130 after multiple cut and heal operations.

Each of the first and second electrodes 110, 120 recover their conductivity, flexibility and transparency (i.e. transmittance) after being cut and self-repairing. The electroluminescence layer 130 also recovers conductivity, flexibility and luminescence after being cut and self-repaired. The EL device 100 as described was tested to characterise performance of the EL device, especially the mechanical properties and the self-repair ability of the EL device 100. The EL device 100 was cut and repaired (i.e. healed) 10 times. FIG. 9a shows a graph of the ionic conductivity of the PAA electrode after multiple cut and self-healing operations. The ionic conductivity was measured by electrochemical impedance spectroscopy (EIS). FIG. 9a shows a plot 900 of ionic conductivity which is measured as mS cm$^{-1}$. As shown in FIG. 9a the ionic conductivity does not substantially change even after 10 cutting and healing times. FIG. 9b shows a plot of the capacitance of the electroluminescence layer 130 after multiple cut and heal operations. As shown in plot 910 the capacitance does not significantly change. The initial capacitance is represented by plot 912. The capacitance after the first cut and heal operation is shown by plot 914. The capacitance after the $5^{th}$ cut and heal operation is shown by plot 916. The $10^{th}$ cut and heal operation is shown by plot 918. As can be seen in plot 910, the capacitance increases slightly after the multiple cut and heal operations.

Figure 9C:
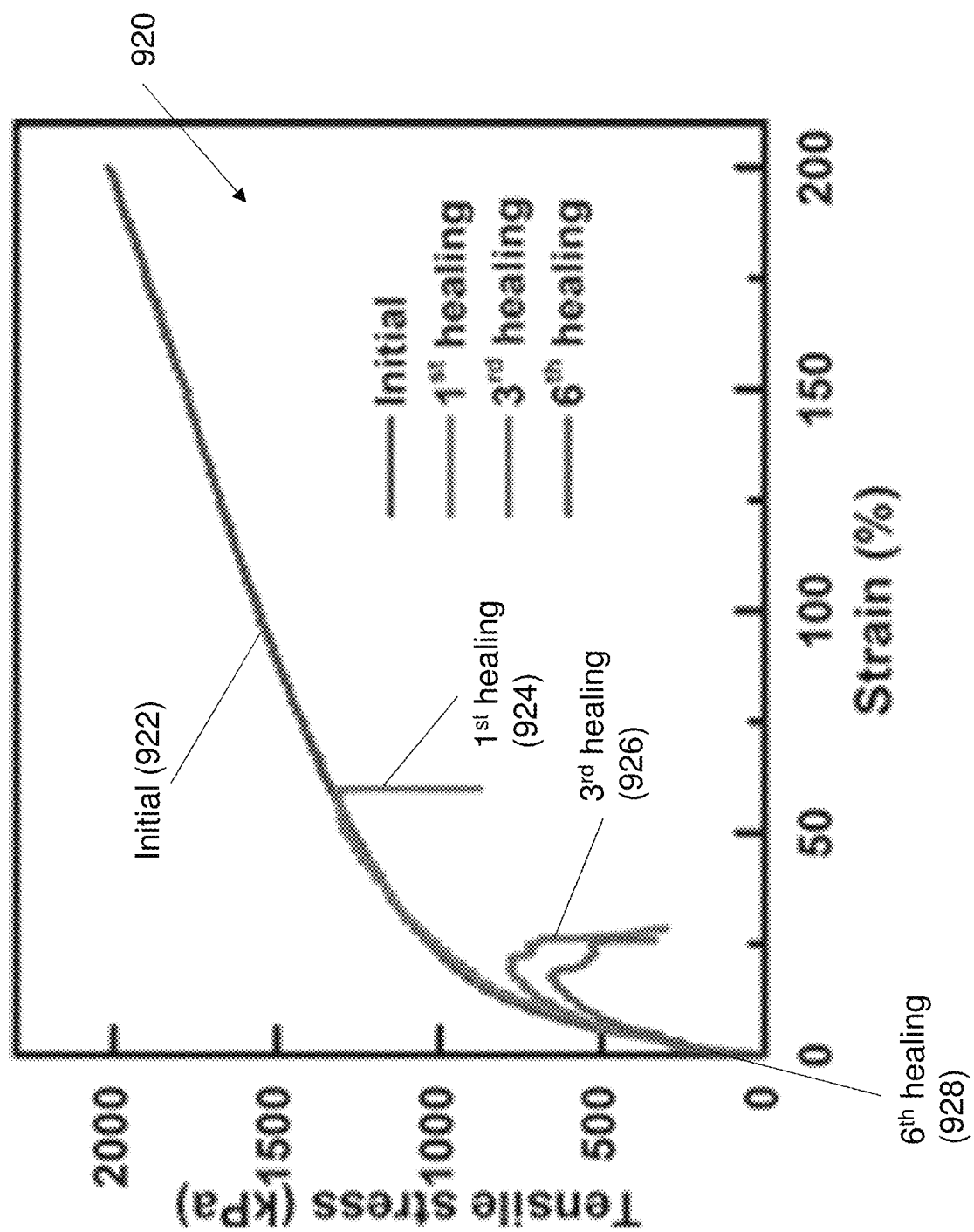
FIG. 9c shows a plot of the tensile strength after multiple cut and heal operations.
Figure 9D:
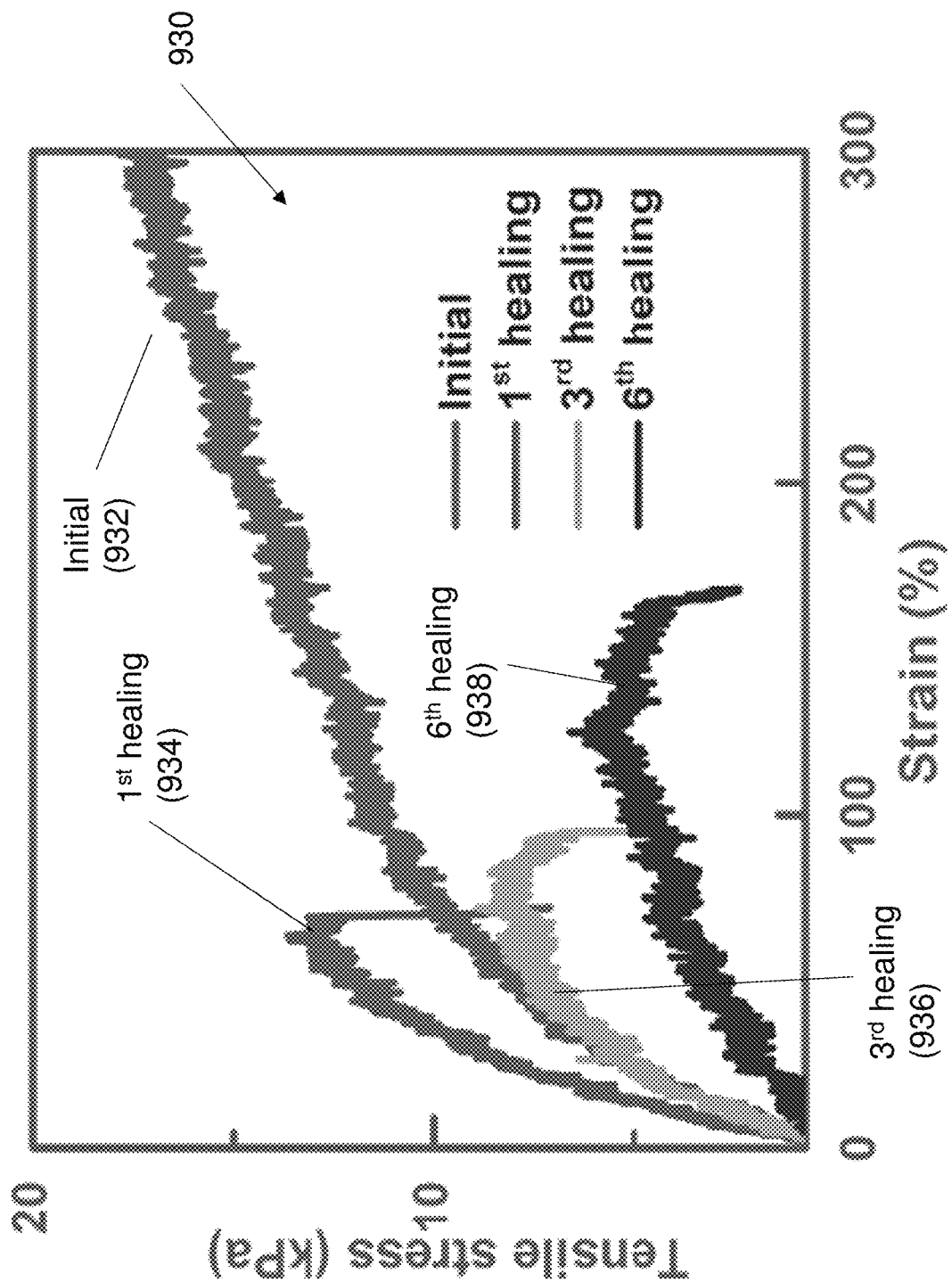
FIG. 9d illustrates a plot of various stress-strain curves of the PAA/NaCl hydrogel.
Figure 9E:
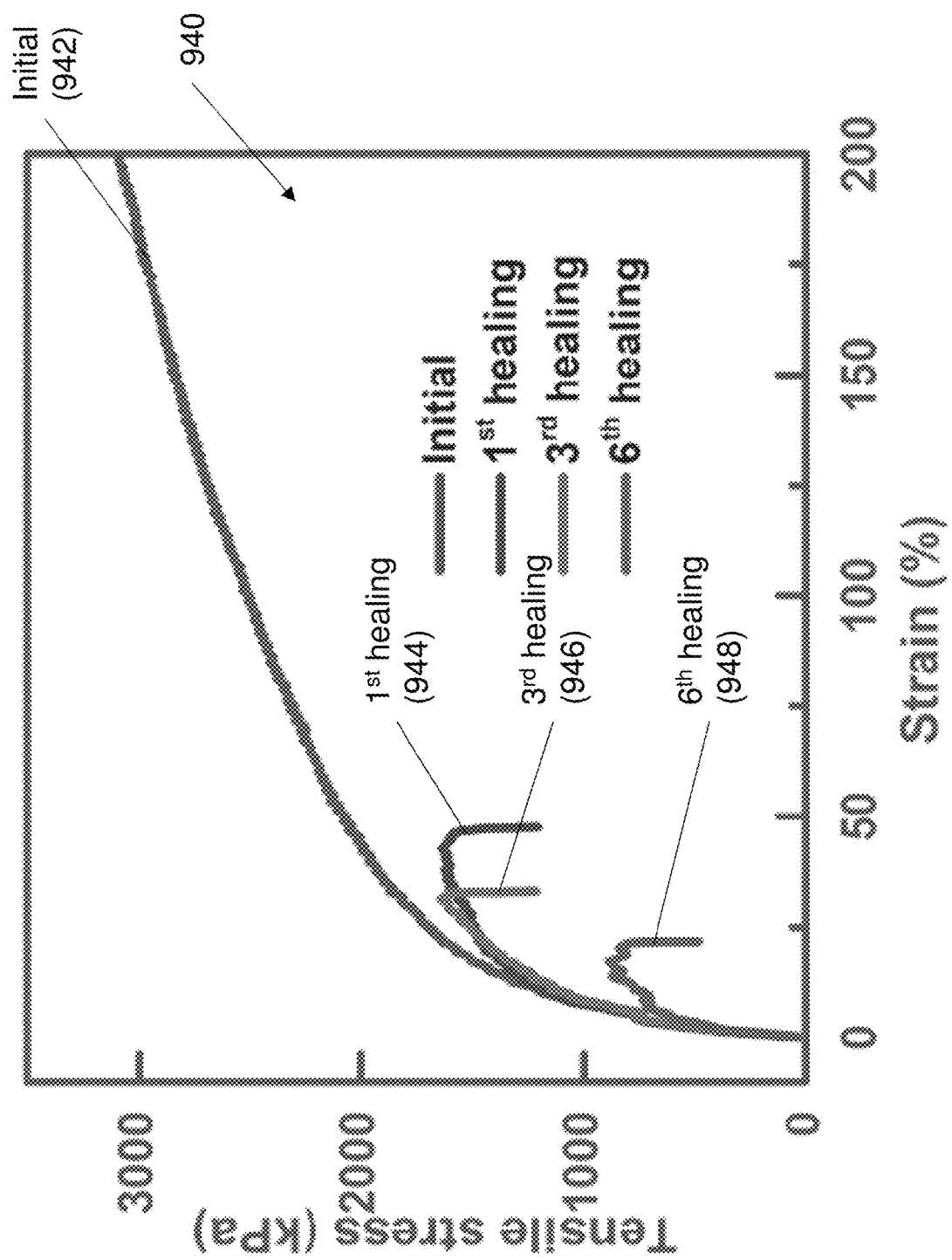
FIG. 9e shows a plot 940 of a plurality of stress-strain curves of the electroluminescence layer

FIG. 9c shows a plot 920 of the tensile strength after multiple cut and heal operations. As can be seen from the plot 920 the tensile strength is substantially retained after multiple cut and healing operations. FIGS. 9d and 9e illustrate the tensile strength of each individual component of the EL device 100, following several cut and healing operations. FIG. 9d illustrates a plot 930 of various stress-strain curves of the PAA/NaCl hydrogel. Curve 932 illustrates an initial stress-strain curve. Curve 934 shows the stress-strain curve after a first healing operation. Curve 936 shows the stress-strain curve after a $3^{rd}$ healing operation. Curve 938 shows a curve after a $6^{th}$ healing operation. FIG. 9e shows a plot 940 of a plurality of stress-strain curves of the electroluminescence layer. Curve 942 illustrates the initial stress-strain curve. Curve 944 shows a stress-strain curve after a first healing operation. Curve 946 shows a stress-strain curve after a $3^{rd}$ healing operation. Curve 948 shows a stress-strain curve after a $6^{th}$ healing operation. Due to the continuous cutting and repair operations there is some permanent mechanical damage to each of the PAA hydrogel (i.e. electrode) and PU composite layer (i.e. electroluminescent layer). The small amounts of permanent damage illustrates the change in the failure point. The failure point is shown by the sudden drop in the stress-strain curve.

After cut-healing processes, both healed electrode and electroluminescence layer polymers can sustain tensile stress. This can restore mechanical strength for each healed layer. The elongation fluctuates due to a "barrel effect" and the mechanical strength restoration results depend on the poorest healing result among the multiple layers. The tensile stress of the PU composite layer were approximately 100 times larger than the PAA/NaCl layer during the mechanical strength tests. The mechanical properties of the healable EL device is dominated by the PU composite layer. The restoration of mechanical strength of the healable PAA electrode were beneficial for rebuilding of integrity of ionic conductor, but its contribution to mechanical strength of the devices during tensile tests is limited compared to the role of the PU layer.

The luminance of the synthetized EL device 100 was tested after repeated cut-heal operations. FIGS. 10a to 10d shows cutting and healing the EL device 100 as well as bending the EL device 100. FIG. 10a shows the original EL device. FIG. 10b shows the EL device being cut into two pieces. FIG. 10c shows the EL device being repaired after the self-repair. As shown in FIG. 10c the EL device 100 can illuminate again after self-healing. The healed region is illustrated by the arrow 1010. FIG. 10d shows the EL device being bent in half about a transverse axis of the EL device. The arrow 1020 shows the bending region. As shown in FIG. 10d the EL device 100 continues to operate even after being bent. The EL device was healed and bent at an angle of 120 degrees. The luminance of the EL device is substantially the same after cutting and healing. As shown in FIG. 10d the luminance is also substantially the same when bent as the initial state.

Figure 11:
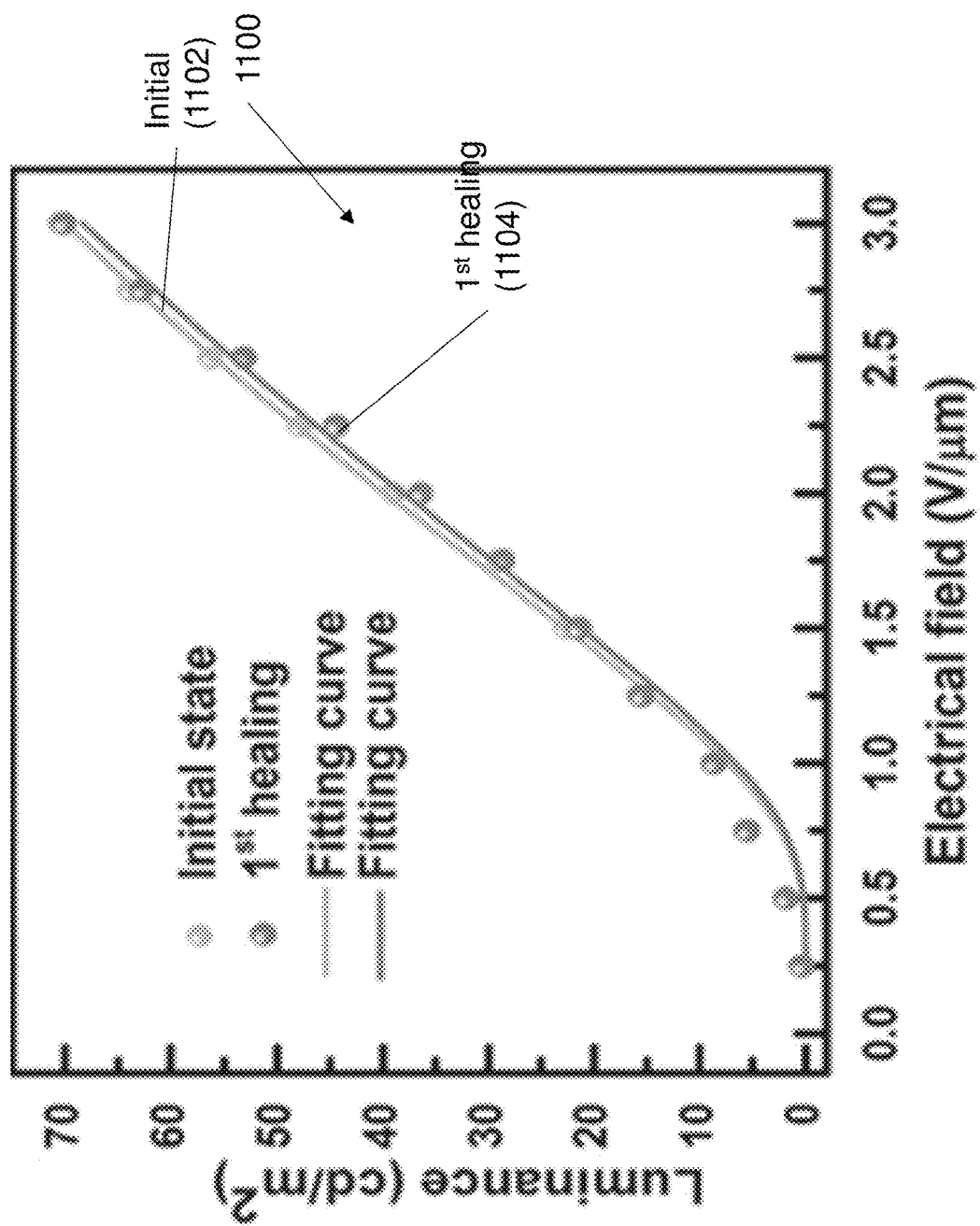
FIG. 11 shows a plot of the luminance-voltage characteristics of the electroluminescent device according to FIG. 1.

FIG. 11 shows a plot 1100 of the luminance-voltage characteristics of the EL device 100. The plot 1100 includes two curves 1102, 1104. The first curve 1102 represents the luminance of the EL device when in an initial state i.e. prior to cutting. As seen from the curve the luminance increases as the electric field increases in strength. The second curve 1104 represents the luminance of the EL device after a cut and self-repair operation. As seen from FIG. 11, the two luminance curves are substantially identical. The luminance of the repaired EL device was substantially uniform and showed only a slight decay (approximately 6.7%) at an electric field of 2 V/μm. The successful reviving of luminance (i.e. light emitting performance) of the EL device can be attributed to the restoration of each functional layer in both mechanical and physicochemical properties. It has also been found that there can be slight variation of the luminance intensity at different points along the EL device. For example the points adjacent the cut have a lower intensity, which might be caused by redistribution of the electric field applied to the electroluminescence layer due to the slight configuration transmutation of the repaired region during a cut-healing process.

The self-repair of the EL device 100 recovers a substantial amount of its luminance. However there is generally some degradation of luminance following multiple cut-repair cycles. The reason for the observed degradation in luminance is some localised permanent shape deformation caused by the cutting. The small permanent deformation causes redistribution of the applied electrical field and thus affects the luminance after cut-healing process. The degradation in luminance increases as the number of cut-heal cycles is increased. However it has been shown that the luminance degradation is minor, and the EL device 100 can continue to function after several cut-heal cycles. It was also observed that the EL device can self-repair and recover its luminance properties after multiple mixed cut modes (i.e. cuts are applied at a specific location or multiple cuts applied at multiple locations). In one example the EL device can continue to function after hundreds of cut-heal cycles.

Multiple EL devices can be combined to create a light emitting system. The light system can be customised to a desired shape by combining multiple EL devices. The light emitting system can be created by exploiting the self-repair ability of the EL devices as described. FIG. 12c shows an exemplary configuration (i.e. embodiment) of a light emitting system 1200. The light emitting system 1200 comprises a plurality of light emitting devices. The light emitting devices 1202, 1204 are arranged in the shape of a "T". The "T" can be illuminated by applying an electric current to the T via the two metal conductors 1212, 1214. The metal conductors form a conductive path through the T shaped light emitting system 1200. The "T" shape was created by cutting a single EL device into two pieces 1202, 1204, and coupling the two pieces 1202, 1204 to form a single light emitting system 1200.

FIG. 12a shows a single EL device 1201. The single EL device 1201 is cut into two pieces 1202, 1204, as shown in FIG. 12b. The two pieces 1202, 1204 are coupled together to form the light emitting system 1200, in the shape of a T, as illustrated in FIG. 12c.

The two pieces each function as individual EL devices. Cutting a large EL device into smaller pieces results in smaller individual EL devices. The two pieces 1202, 1204 are coupled by using the self-healing ability of each of the pieces 1202, 1204. The two pieces 1202, 1204 are held against each other. The two pieces may be covered by a solvent to improve (i.e. facilitate) healing. The two pieces selfheal and become coupled together to form the "T" shape. Each layer of each EL device 1202, 1204 self-heals and couples to the corresponding adjacent layers between the two devices. For example the first electrode of the first EL device heals and couples to the first electrode of the second EL device at the locations where the two EL devices are brought into contact with each other. Similar healing occurs for the electroluminescence device and the second electrode.

Figure 12D:
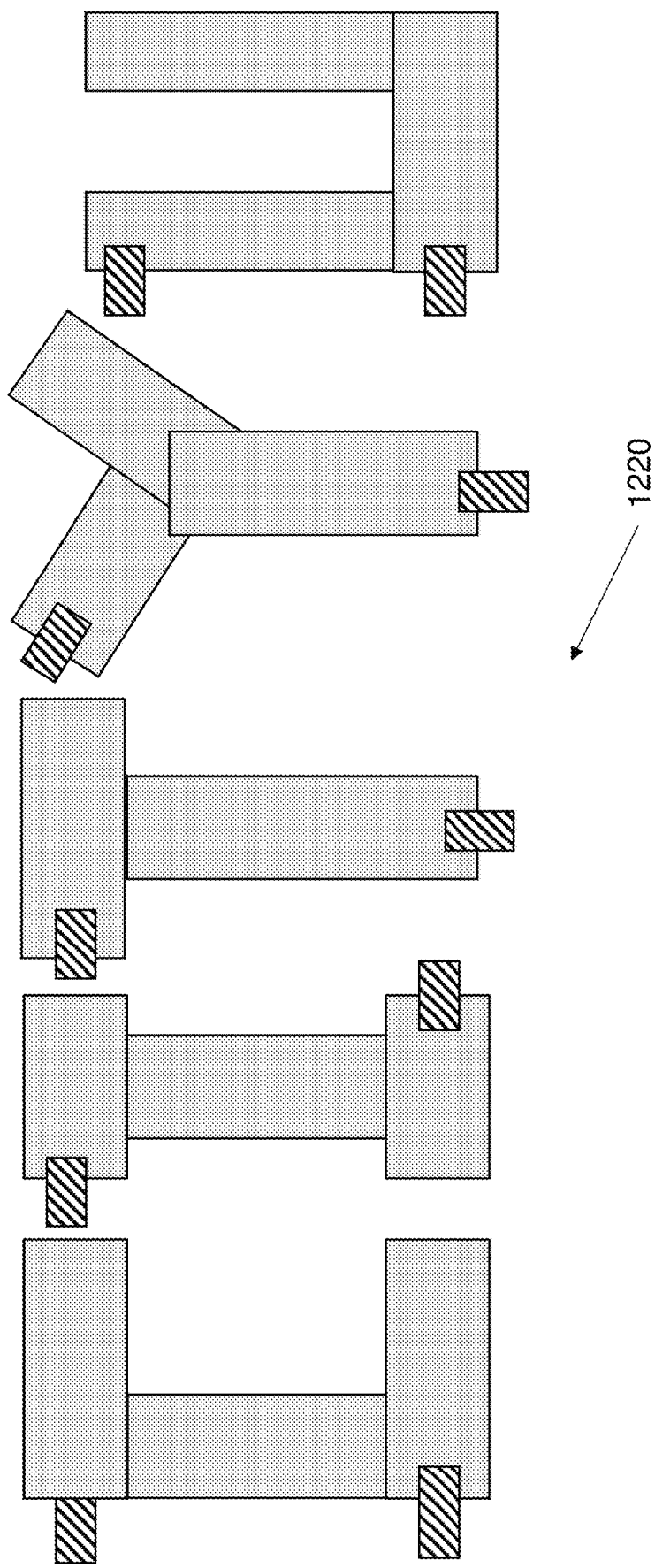
FIG. 12d shows a further exemplary light emitting system where the electroluminescent devices are arranged to spell CITYU.

FIG. 12d shows a further exemplary light emitting system 1220. The light emitting system 1220 comprises a plurality of EL devices. The EL devices are arranged to spell CITYU. The light emitting system 1220 is illuminated when an electric current is applied to the system (i.e. an electric current is applied to all the EL devices). The EL devices may all be formed from a single large EL device that is cut into several smaller ones. The light emitting system can be easily formed by repairing and coupling multiple small EL devices formed by cutting a large EL device. Each of the smaller pieces also function as individual EL devices. The CITYU configuration is formed by coupling the smaller EL devices to each other, wherein each of the smaller EL devices are coupled by exploiting the self-repair ability of each EL device (the self-repair ability being described earlier). The light emitting system can be constructed into any suitable shape or configuration since EL devices can be cut into desired custom shapes and coupled together to form a light emitting system. The EL device structure as described herein is particularly advantageous because it allows customization of shapes and arrangements by exploiting the self-repair ability of the EL device. In one example the colour of each of the electroluminescent devices that forms the light emitting system can be changed by doping the electroluminescence layer of each of the electroluminescent devices. The doping can change the wavelength emission.

In an alternative configuration (not illustrated) each of the first and second electrode may be formed from a hydrogel that is configured to absorb mechanical loads and dissipate energy from mechanical loads. In this alternative configuration the hydrogel comprises a polymer matrix and the polymer matrix comprises at least two crosslink structures. The crosslink structures are configured to dissipate energy from any mechanical loads that are acting on the first electrode and/or second electrode. Mechanical loads may be any axial loads (e.g. tension, compression) or bending loads or torsional loads or shearing loads. The crosslink structures comprise a first covalent crosslink structure that includes covalent bonds or hydrogen bonds and a second ionic crosslink structure that includes ionic bonds. The first crosslink structure is defined by a first polymer comprising an acrylamide and the second crosslink structure is defined by an alginate.

In this alternative configuration the first polymer comprises a polyacrylamide (PAAm) polymer that is covalently cross linked thereby defining the covalent crosslink structure. The second polymer comprises an aluminium alginate (Al-alginate) polymer that is ionically cross linked thereby defining the ionic crosslink structure. In this alternative configuration the hydrogel may also include an aqueous solution comprising a crosslinking agent e.g. a salt or an acid or Ca ions or Mg ions or Zn ions or Fe ions or Al ions.

The ionic crosslink structure is configured to dissipate energy when the electroluminescent energy is subjected to mechanical loads by rupturing the ionic bonds within the ionic crosslink structure. The breaking of these ionic bonds dissipates the energy from the mechanical loading. The ionic bonds are restored (i.e. reformed) once the mechanical loads are removed from the electroluminescent device. The covalent crosslink structure is configured to provide a bridging structure to maintain the physical boundaries of each electrode. The covalent bonds generally remain and do not break hence prevents the electrode from dissociating.

This alternative configuration of the first and second electrode can be used with the electroluminescence layer as disclosed above. In this alternative configuration the electroluminescent layer can comprise first and second electrodes as disclosed in this alternative configuration with an electroluminescence layer as described earlier.

The electroluminescent device is flexible in response to one or more of bending loads, torsion loads, tensile loads and compression loads, the electroluminescent device is flexible such that function of the electroluminescence device is maintained in response to any one or more of the loads. The electroluminescent device is flexible in response to all of the loads such that function of the electroluminescence device is maintained in response to all of the loads.

The presently invention provides a flexible and repairable electroluminescent device (EL device) that restores its mechanical strength, mechanical properties, physicochemical properties and luminance after being cut. The described EL device is self-repairable. The self-repair ability expands the lifespan of the EL device. The EL device can also be easily and cost effectively be replaced and maintained. The EL device can be cut into multiple pieces and formed into a light emitting system comprising a customized configuration. The EL device as described is mechanically flexible in response to multiple mechanical loadings, and hence can be easily adapted into custom shapes. The flexible EL device can be adopted into forming complex electronic systems such as for example light emitting modules or flexible electronics or wearable devices. The self-repair ability of EL device is also advantageous because it helps to extend the operational life span of each EL device. The self-repair ability of the EL device helps to preserve its luminance properties even after multiple cut operations thus improving the operational life span and simplifying the repair process. The EL device can be easily repaired because of the self-repair ability of the EL device. The EL device can be cut (i.e. divided) into smaller pieces, and each of the smaller pieces maintaining all the properties of the larger device. Each of the smaller pieces also function as individual EL devices. This broadens the applications and usability of the EL device. The smaller pieces can be coupled together, by the self-repair ability, to form a customised light emitting system. The self-repair ability is advantageous because it reduces the complexity, time and cost of repairing EL devices in various products. Individual EL devices within a larger light emitting system can be easily replaced or repaired since a new EL piece can be coupled to adjacent pieces by using the self-repair ability.

The description of any of these alternative configurations is considered exemplary. Any of the alternative embodiments and features in the alternative embodiments can be used in combination with each other or with the embodiments or configurations described with respect to the figures.

The foregoing describes only a preferred embodiment of the present invention and modifications, obvious to those skilled in the art, can be made thereto without departing from the scope of the present invention. While the invention has been described with reference to a number of preferred embodiments it should be appreciated that the invention can be embodied in many other forms.

The invention claimed is:

1. An electroluminescent device comprising:
an electrode, the electrode being ionically conductive
an electroluminescence layer positioned adjacent or in contact with the electrode, the electroluminescence layer being electrically coupled to the electrode,
the electroluminescence layer receiving electrical energy from the electrode and illuminating in response to received electrical energy, and;
wherein the electrode and the electroluminescence layer are repairable such that the function of the electrode and the electroluminescence layer is restored after a deformation;
wherein the first electrode and second electrode each comprise an ionically conductive hydrogel and a metal conductor coupled to the ionically conductive hydrogel;
wherein the ionically conductive hydrogel comprises an polyacrylic acid and a salt, dissolved into the hydrogel; and
wherein the first electrode and second electrode each comprise a layer of electrically conductive metal disposed on the hydrogel to form an electrical double layer on each of the first electrode and second electrode.

2. The electroluminescent device in accordance with claim 1, wherein the electrode and the electroluminescence layer each are repairable such that the function of the electrode and the electroluminescence layer is restored even after being cut.

3. The electroluminescent device in accordance with claim 1, wherein the electroluminescence device comprises a first electrode, a second electrode, the electroluminescence layer being sandwiched between the first electrode and the second electrode and the electroluminescence layer arranged in electrical communication with the first electrode and the second electrode.

4. The electroluminescent device in accordance with claim 1, wherein the electroluminescence layer comprises a polymer and an electroluminescent material.

5. The electroluminescent device in accordance with claim 4, wherein the electroluminescent material comprises a luminescent centre, a dielectric polymer host-binder, and/or a dielectric enhancement additive.

6. The electroluminescent device in accordance with claim 1, wherein the first electrode and second electrode are substantially transparent to allow transmittance of light from the electroluminescence layer outwardly.

7. The electroluminescent device in accordance with claim 6, wherein the first electrode and the second electrode comprise greater than 96% average transmittance in the range of visible light.

8. The electroluminescent device in accordance with claim 1, wherein the first electrode, second electrode and the electroluminescence layer are self-repairable such that the function of the electrode and the electroluminescence layer is restored after a deformation by reforming hydrogen bonds between two adjacent polymer portions.

9. The electroluminescent device in accordance with claim 1, wherein the electroluminescence device is self-repairable after the device is cut such that the function, mechanical and physicochemical properties of the electroluminescence device are restored and the structure of the electroluminescence device is restored when the cut portions are positioned adjacent each other or positioned in contact with each other.

10. An electroluminescent device comprising:
a multi-layer structure,
the multi-layer structure comprising a first electrode, a second electrode and a electroluminescence layer, the electroluminescence layer being sandwiched between the first electrode and the second electrode,
the first electrode and second electrode each including a hydrogel and an electrically conductive metal disposed in contact with the hydrogel,
the electroluminescence layer comprising a polymer and a metal sulphide,
the first electrode and second electrode arranged in electrical communication with the electroluminescence layer, the electroluminescence layer configured to emit light in response to receiving electrical energy,
the first electrode and second electrode each are ionically conductive and optically transparent, and
at least one electrode and the electroluminescence layer configured to be self-repairable in response to mechanical strain and/or physical separation of electroluminescent device such that mechanical properties and physicochemical properties of the electrode and the electroluminescence layer are restored.

11. The electroluminescent device in accordance with claim 10, wherein the first electrode and the second electrode each comprise a hydrogel with one or more dissoluble salts.

12. The electroluminescent device in accordance with claim 11, wherein the first electrode and the second electrode each comprise a polyacrylic acid (PAA) hydrogel and sodium chloride mixed therein.

13. The electroluminescent device in accordance with claim 10, wherein the electroluminescence layer comprises a polymer, and a nitride component and an electroluminescence material being dispersed onto the polymer, the electroluminescence material being a material that emits light in response to receiving electrical energy.

14. The electroluminescent device in accordance with claim 13, wherein the polymer comprises a polyurethane matrix, the nitride component comprises hydroxylated boron nitride nanosheets disposed onto or within the polyurethane matrix and the electroluminescence layer comprises zinc sulphide particles disposed onto or within the polyurethane matrix.

15. The electroluminescent device in accordance with claim 13, wherein the electroluminescence material comprises a phosphor composite.

16. The electroluminescent device in accordance with claim 10, wherein the first electrode and the second electrode are structured to have 96% average transmittance in the range of visible light.

17. The electroluminescent device in accordance with claim 10, wherein the electroluminescent device is flexible about at least one axis and self-repairable after being cut into two or more pieces.

18. The electroluminescent device in accordance with claim 11, wherein the hydrogel comprises a polymer matrix and the polymer matrix comprising at least two crosslink structures, the crosslink structures configured to dissipate energy received from mechanical loads applied to the electroluminescence device.

19. The electroluminescent device in accordance with claim 18, wherein the crosslink structures comprise an ionic crosslink structure that includes ionic bonds and a covalent crosslink structure that includes covalent bonds or hydrogen bonds.

20. The electroluminescent device in accordance with claim 19, wherein the covalent and hydrogen bonding crosslink structures are configured to dissipate energy when electroluminescent device is subjected to mechanical loads by rupturing the hydrogen bonds within the crosslinked structure and restore the hydrogen bonds when the electroluminescent device is restored; and the covalent crosslink structure is configured to provide a bridging structure to maintain the physical boundaries of each electrode.

21. The electroluminescent device in accordance with claim 10, wherein the electroluminescent device is flexible in response to one or more of bending loads, torsion loads, tensile loads and compression loads, the electroluminescent device is flexible such that function of the electroluminescence device is maintained in response to any one or more of the loads.

* * * * *